United States Patent
Iwamoto et al.

[11] Patent Number: 6,163,491
[45] Date of Patent: Dec. 19, 2000

[54] SYNCHRONOUS SEMICONDUCTOR MEMORY DEVICE WHICH CAN BE INSPECTED EVEN WITH LOW SPEED TESTER

[75] Inventors: Hisashi Iwamoto; Takashi Kubo, both of Hyogo, Japan

[73] Assignee: Mitsubishi Denki Kabushiki Kaisha, Tokyo, Japan

[21] Appl. No.: 09/226,163

[22] Filed: Jan. 7, 1999

[30] Foreign Application Priority Data

Jul. 24, 1998 [JP] Japan .................................. 10-209523

[51] Int. Cl.[7] ...................................................... G11C 7/00
[52] U.S. Cl. ............... 365/201; 365/230.03; 365/230.04; 365/233
[58] Field of Search ................................... 365/201, 233, 365/230.03, 203, 230.04

[56] References Cited

U.S. PATENT DOCUMENTS

| 5,764,590 | 6/1998 | Iwamoto et al. ........................ 365/233 |
| 5,798,979 | 8/1998 | Toda et al. .............................. 365/233 |
| 5,812,490 | 9/1998 | Tsukude .................................. 365/233 |
| 5,892,730 | 4/1999 | Sato et al. .............................. 365/233 |
| 5,926,434 | 7/1999 | Mori ....................................... 365/233 |
| 5,946,266 | 8/1999 | Iwamoto et al. ........................ 365/233 |

OTHER PUBLICATIONS

"A 640MB/s Bi–Directional Data Strobed, Double–Data–Rate SDRAM with a 40mW DLL Circuit for a 256MB Memory System", by C. Kim, et al, 1998 IEEE International Solid State Circuits Conference, pp. 158–159.

Primary Examiner—Richard Elms
Assistant Examiner—Hien Nguyen
Attorney, Agent, or Firm—McDermott, Will & Emery

[57] ABSTRACT

A synchronous semiconductor memory device includes a prefetch selector receiving first and second data respectively read from first and second memory cells corresponding to even and odd addresses for outputting them to a data input/output terminal. The prefetch selector sequentially outputs first and second data to the data input/output terminal in one period of a clock period in the normal operation, determines if the first and second data match in a test mode, and outputs the determination result to the data input/output terminal in one period of the clock period.

11 Claims, 18 Drawing Sheets

INPUT DATA SELECTOR

BANK SELECTOR

WRITE DRIVER

WRITE DRIVER

SYNCHRONOUS SEMICONDUCTOR MEMORY DEVICE WHICH CAN BE INSPECTED EVEN WITH LOW SPEED TESTER

BACKGROUND OF THE INVENTION

1. Field of the Invention

The present invention relates to synchronous semiconductor memory devices externally inputting/outputting a signal in synchronization with a clock signal which is externally applied periodically, and more particularly, to a synchronous dynamic random access memory (which is hereinafter referred to as an SDRAM) allowing random access.

2. Description of the Background Art

In a memory application system, although a dynamic random access memory (a DRAM) which is used as a main storage is increasingly becoming higher in speed, an operation speed thereof is not still following that of a micro processor unit (MPU). As a result, it is often said that the performance of the whole system is limited by the access and cycle time of the DRAM. Recently, a double data rate SDRAM (DDR SDRAM) has been proposed as a main storage for a high speed MPU which operates in synchronization with a complementary clock signal.

For allowing rapid access in the DDR SDRAM, a specification has been proposed which allows rapid access of for example four successive data for one data input/output terminal in synchronization with a complementary system clock signal (ext. CLK, ext. / CLK; / hereinafter represents inversion, designation, complementariness or the like).

FIG. 19 is a diagram of operation waveform showing an operation of the DDR SDRAM at the time of accessing.

In the DDR SDRAM, 8-bit data (byte data) can be input or output to or from data input/output terminals DQ0 to DQ7, and FIG. 19 shows an operation of successively writing or reading four data (8×4=32 bits in total).

The number of successively read data is called a burst length and can be changed by a mode register in the DDR SDRAM.

An operation mode is determined by a combination of states of external control signals /RAS, /CAS and /WE at the edge of an external clock signal ext. CLK. The combination of states of the external control signals is generally called a command. External control signals /RAS, /CAS and /WE respectively correspond to a row address strobe signal, a column address strobe signal and a write enable signal. A signal Add. is an address signal which is externally applied, a signal DQS is a data strobe signal indicating a timing of data inputting/outputting, and a signal D/Q is a data signal which is input/output through the data input/output terminal.

Referring to FIG. 19, at a time t1, external control signals /RAS, /CAS and /WE and address signal Add. are incorporated at the rising edge of clock signal ext. CLK. Address signal Add. is applied by time divisionally multiplexing row and column address signals X and Y. If external control signal /RAS is at "L" (LOW) level in an active state and the rising edge of clock signal ext. CLK at t1, address signal Add. at the time is incorporated as a row address Xa.

If external control signal /CAS is at the L level in the active state at the rising edge of clock signal ext. CLK at a time t2, address signal Add. at the time is incorporated as a column address Yb.

The signal representing the command and the address signal are incorporated at the rising edge of ext. CLK. An operation of selecting a row and column is performed in the DDR SDRAM in accordance with incorporated row column addresses Xa and Yb.

At a time t4, when a prescribed clock period (which is 3.5 clock cycles in FIG. 19) is elapsed after external control signal /RAS falls to the L level, the first four data q0, q1, q2 and q3 are output from time t4 to t8. The four data are output in response to a cross point of clock signals ext. CLK and ext. /CLK.

For enabling high speed data transfer, a data strobe signal DQS for transmitting a timing at which the data is received is also output in phase with the output data.

Further, at a time t3, rewriting (precharging) to a memory cell is performed if external control signals /RAS and /WE are at the L level at the rising edge of clock signal ext. CLK.

The writing operation is represented by waveforms after a time t9. In the writing operation, a row address Xc is incorporated as in the case of the reading of the data.

At a time t10, if external control signals /CAS and /WE are both at the L level in the active state at the rising edge of clock signal ext. CLK, column address Yd is incorporated and a data d0 which has been applied at a time t11 is also incorporated as the first data to be written.

In other words, a row and column selection operation is performed in the DDR SDRAM in response to the fall of external control signals /RAS and /CAS. Input data d1, d2 and d3 are sequentially incorporated in synchronization with data strobe signal DQS from time t12 to t14, and the input data are written to the memory cell.

As described above, in the conventional DRAM which does not operate in synchronization with the clock, the address signal, input data or the like are incorporated in synchronization with external control signals such as row address strobe signal /RAS and column address strobe signal /CAS for operation. In the SDRAM, however, external signals such as address strobe signals /RAS and /CAS and address signal Add. are incorporated at the rising edge of clock signal ext. CLK, and the input data is incorporated in synchronization with data strobe signal DQS.

Thus, one advantage of performing the synchronization operation for externally incorporating a signal and data in synchronization with the external clock signal is that it is necessary to keep a large margin of data input/output timing. It is because that the skew of the address signal (the difference in timing) does not affect the cycle time. As a result, cycle time can be reduced.

As an architecture for implementing the DDR SDRAM, C. Kim et al. have presented 2-bit prefetch mode (1998, IEEE International Solid State Circuits Conference pp.158–159).

FIG. 20 is a diagram schematically showing a structure of a DDR SDRAM having a 2-bit prefetch mode. FIG. 20 shows structures of a portion related to 1-bit data reading and of a peripheral circuit related to reading. The portion related to data reading is provided corresponding to each of data input/output terminals.

Referring to FIG. 20, the DDR SDRAM includes memory arrays 1*aa*, 1*ab*, 1*ba* and 1*bb* each having a plurality of memory cells arranged in a matrix.

The SDRAM has two banks, where memory arrays 1*aa* and 1*ab* form a bank A and memory arrays 1*ba* and 1*bb* form a bank B.

In banks A and B, memory arrays 1*aa*, 1*ab*, 1*ba* and 1*bb* respectively correspond to sub banks A0, A1, B0 and B1.

In the 2-bit prefetch mode, the SDRAM functions as a 2-bank SDRAM. Banks A and B can independently be driven into an active/inactive state. Designation of bank is performed by a bank address which is applied along with each command.

Provided for memory array 1aa are: a group of X decoders 2aa activated upon activation of a bank address signal BX for decoding row address signals X0–Xj (X0–j) and driving an addressed row of memory array 1aa into a selection state; a group of sense amplifiers 3aa activated upon activation of a sense amplifier activation signal φSAA for detecting, amplifying and latching data for memory cell which is connected to a selected row of memory array 1aa; and a group Y decoders 4aa activated upon activation of a bank address signal BY for decoding column address signals YE0–YEk (YE0–k) and selecting an addressed column of memory array 1aa.

A memory cell in the column which is selected by a group of Y decoders 4aa is connected to an internal data bus 5aa. Bank address signal BX is applied along with an active command or a precharge command which instructs return to the precharged state. Bank address signal BY is applied along with a read command or write command.

Provided for memory array 1ab are: a group of X decoders 2ab activated upon activation of bank address signal BX for decoding row address signals X0–Xj (X0–j) and driving an addressed row of memory array 1ab into the selection state; a group of sense amplifier 3ab activated upon activation of sense amplifier activation signal φSAA for detecting, amplifying and latching data for memory cell which is connected to a selected row of memory array 1ab; and a group of Y decoders 4ab activated upon activation of bank address signal BY for decoding column address signals YO0–YOk (YO0–k) and selecting an addressed column of memory array 1ab.

A memory cell in the column which is selected by a of group of Y decoders 4ab is connected to an internal data bus 5ab.

Provided for memory array 1ba are: a group of X decoders 2ba activated upon activation of a bank address signal /BX for decoding row address signals X0–Xj (X0–j) and driving an addressed row of memory array 1ba into the selection state; a group of sense amplifiers 3ba activated upon activation of a sense amplifier activation signal φSAB for detecting, amplifying and latching data for memory cell which is connected to the selected row of memory array 1ba; and a group of Y decoders 4ba activated upon activation of a bank address signal /BY for decoding column address signals YE0–YEk (YE0–k) and selecting an addressed column of memory array 1ba.

A memory cell in the column which is selected by a group of Y decoders 4ba is connected to an internal data bus 5ba.

Provided for memory array 1bb are: a group of X decoders 2bb activated upon activation of bank address signal /BX for decoding row address signals X0–Xj (X0–j) and driving an addressed row of memory array 1bb into the selection state; a group of sense amplifiers 3bb activated upon activation of sense amplifier activation signal φSAB for detecting, amplifying and latching data for memory cell which is connected to the selected row of memory array 1bb; and a group of Y decoders 4bb activated upon activation of bank address signal /BY for decoding column address signals YO0–YOk (YO0–k) for selecting an addressed column of memory array 1bb.

A memory cell in the column which is selected by a group of Y decoders 4bb is connected to an internal data bus 5bb.

Here, the group of X decoders includes X decoders arranged corresponding to rows, the group of sense amplifiers includes sense amplifiers arranged corresponding to the columns of a corresponding to memory array, and the group of Y decoders includes Y decoders arranged corresponding to columns.

In memory arrays 1aa and 1ab, memory selection operations are simultaneously performed in accordance with bank address signals BX and BY. On the other hand, in memory arrays 1ba and 1bb, selection operations are simultaneously performed in accordance with bank address signals /BX and /BY.

For reading data from memory array 1aa, a read preamplifier/register 22a is provided for receiving, amplifying and latching data from memory array 1aa which has been read onto internal data bus 5aa by a group of sense amplifiers 3aa in response to activation of a register activation signal φRBA 0.

For reading data from memory array 1ab, a read preamplifier/register 22b is provided for receiving, amplifying and latching data from memory array 1ab which has been read onto internal data bus 5ab by a group of sense amplifiers 3ab in response to activation of a register activation signal φRBA 1.

For reading data from memory array 1ba, a read preamplifier/register 24a is provided for receiving, amplifying and latching data from memory array 1ba which has been read onto internal data bus 5ba by a group of sense amplifiers 3ba in response to activation of a register activation signal φRBB 0.

For reading data from memory array 1bb, a read preamplifier/register 24b is provided for receiving, amplifying and latching data from memory array 1bb which has been read onto internal data bus 5bb by a group of sense amplifiers 3bb in response to activation of a register activation signal φRBB 1.

A bank selector 302a is provided for read preamplifier/registers 22a and 24a. Bank selector 302a selects and outputs one of a data signal /DAA0 output from read preamplifier/register 22a and a data signal /DAB0 output from read preamplifier/register 24a in accordance with data selection signals BA0, /BA0, BA1 and /BA1.

A bank selector 302b is provided for read preamplifier/registers 22b and 24b. Bank selector 302b selects and outputs one of a data signal /DAA1 output from read preamplifier/register 22b and a data signal /DAB1 output from read preamplifier/register 24b in accordance with data selection signals BA0, /BA0, BA1 and /BA1.

Provided for bank selectors 302a and 302b are: a prefetch selector 304 selecting a signal from one of bank selectors 302a and 302b in accordance with selection signals φSEO and φSEE; an output buffer 28 receiving and amplifying an output from prefetch selector 304; and a data input/output terminal 6 externally outputting an output signal from output buffer 28.

The synchronous semiconductor memory device further includes a control signal generation circuit 13 incorporating external control signals ext. /RAS, ext. /CAS, ext. /CS and ext. /WE which are respectively applied to input terminals 12a, 12b, 12c and 12d in synchronization with the rising of clock signal CLK and inverting the states thereof for producing internal control signals φxa, φya, φW, φCS, φR and φCA.

Signal ext. /CS is a chip select signal, and the synchronous semiconductor memory device inputs/outputs data when chip select signal ext. /CS is in the activation state.

Clock signal CLK is internally generated in accordance with an external clock signal ext. CLK.

Signal φxa is activated when the active command is applied and instructs incorporation of the row address signal. Signal φya is activated when the read or write command is applied and instructs incorporation of the column address signal. Signal φW is activated when the write command is applied and instructs writing of data. Signal φR is activated when the active command is applied and activates a circuit in the portion related to row selection. Signal φCA is activated when the read or write command is applied and activates a circuit in the portion related to column selection and data inputting/outputting (a column related circuit).

The synchronous semiconductor memory device further includes: an X address buffer 14 incorporating external address signals ext. A0–Ai (A0–i) in response to activation of a row address incorporated instruction signal φxa for generating internal row address signals X0–Xj (X0–j) and bank address signal BX; a Y address buffer 15 activated upon activation of a column address incorporation instruction signal φya for incorporating external address signals ext. A0–Ai and generating an internal column address signal; and a Y address operation circuit 16 changing an address in a prescribed sequence in synchronization with clock signal CLK using an internal column address signal which is applied from Y address buffer 15 as a leading address for generating even column address signals YE0–YEk (YE0–k), odd column address signals YO0–YOk (YO0–k) and bank address signals BY, BA0,BA1 (BAO, 1), /BA0, /BA1 (/BA0, 1).

Y address operation circuit 16 includes a burst address counter and changes the column address signal every two clock cycles.

The synchronous semiconductor memory device further includes: a clock counter 17 counting internal clock signal CLK in accordance with activation of column related activation signal φCA for generating a count up signal at a prescribed timing in accordance with the count value; and a control signal generation circuit 32 receiving the count up signal from clock counter 17, bank address signals BX and BY and a least significant bit Y0 of the column address signal for producing various internal control signals φRBB0, φRBB1, φRBA0, φRBA1, φSAA, φSAB, φSEO and φSEE.

A control signal for a bank which is designated in accordance with bank address signals BX and BY is brought into an active state. The least significant bit of Y0 of the column address signal is used for indicating which one of the two memory arrays included in one bank should be first accessed.

Clock counter 17 counts a CAS latency and burst length, and generates a count up signal at a prescribed timing in accordance with a designated operation mode.

A circuit related to writing is not shown in FIG. 20.

The synchronous semiconductor memory device is characterized in that each bank is divided into two sub banks and, a read preamplifier, register or the like is provided corresponding to each sub bank. Therefore, the number of the read preamplifiers, registers or the like is twice that of a usual SDRAM. In FIG. 20, the synchronous semiconductor memory device is exemplified as having two banks. The banks can independently be accessed.

FIG. 21 is a circuit diagram showing an exemplary structure of bank selector 302a shown in FIG. 20.

Referring to FIG. 21, bank selector 302a includes: P channel MOS transistors 322 and 324 connected in series between a power supply node and a node N50 and respectively having their gates receiving a data signal /DAA0 and a data selection signal /BA0; N channel MOS transistors 326 and 328 connected in series between node N50 and a ground node and respectively having their gates receiving a data selection signal BA0 and a data signal /DAA0; P channel MOS transistors 330 and 332 connected in series between a power supply node and node N50 and respectively having their gates receiving a data signal /DAB0 and a data selection signal /BA1; and N channel MOS transistor 334 and 336 connected in series between node N50 and a ground node and respectively having their gates receiving a data selection signal BA1 and a data signal /DAB0.

Node N50 is an output node of bank selector 302a, from which a data signal DATAE which is read from the memory array corresponding to an even address is output.

Bank selector 302a inverts data signal /DAA0 which has been read to and latched at a read preamplifier/register 22a from memory array 1aa and output it as data signal DATAE when data selection signal BA0 is activated. On the other hand, when data selection signal BA1 is activated, bank selector 302a inverts data signal /DAB0 which is read to from memory array 1ba and latched at a read preamplifier/register 24a and outputs it as data signal DATAE.

FIG. 22 is a circuit diagram showing an exemplary structure of bank selector 302b shown in FIG. 20.

Referring to FIG. 22, bank selector 302b includes: P channel MOS transistors 342 and 344 connected in series between a power supply node and a node N52 and respectively having their gates receiving a data signal /DAA1 and data selection signal /BA0; N channel MOS transistors 346 and 348 connected in series between node N52 and a ground node and respectively having their gates receiving data selection signal BA0 and a data signal /DAA1; P channel MOS transistors 350 and 352 connected in series between the power supply node and node N52 and respectively having their gates receiving a data signal /DAB1 and data selection signal /BA1; and N channel MOS transistors 354 and 356 connected in series between node N 52 and a ground node and respectively having their gates receiving data selection signal BA1 and data signal /DAB1.

Node N52 is an output node of bank selector 302b, from which a data signal DATA0 which is read from the memory array corresponding to an odd address is output.

When data selection signal BA1 is activated, bank selector 302b inverts data signal /DAA1 which is read to and latched at a read preamplifier/register 22b from memory array 1ab and outputs it as data signal DATA0. When data selection signal BA1 is activated, on the other hand, bank selector 302b inverts data signal /DAB1 which is read to and latched at a read preamplifier/register 24b from memory array 1bb and outputs it as data signal DATAO.

FIG. 23 a circuit diagram showing an exemplary structure of prefetch selector 304 shown in FIG. 20.

Referring to FIG. 23, prefetch selector 304 includes: an inverter 362 receiving and inverting data signal DATAE for outputting it to a node N54 when a control signal SEE is activated; and an inverter 364 receiving and inverting data signal DATAO for outputting it to node N54 when a control signal SEO is activated. Node N54 is an output node of prefetch selector 304 and outputs a data signal to output buffer 28.

Referring to FIG. 20 again, to briefly describe the operation, when a read command is input from terminals 12a to 12d, a Y decoder corresponding to an address thereof is activated. At the time, a selection line corresponding to the applied address and an address which is obtained by incrementing the address by one are activated. Thus, 2-bit data are read to read preamplifiers 22a, 22b, 24a, and 24b for each DQ terminal, and data of the bank which is selected by bank selectors 302a and 302b are input to the prefetch selector. The input 2-bit data are alternately output to the output buffer by the prefetch selector. This architecture advantageously reduces an operation frequency of the memory array to half as compared with the reading frequency, thereby facilitating the array operation.

In the DDR SDRAM, data is output using a cross point of clock signal ext. CLK as a trigger. A data rate which is twice a single data rate of the SDRAM which outputs data in synchronization with the rising edge of clock signal ext. CLK is achieved. Thus, when it is operated with a low speed tester having a low clock frequency, the operation frequency of the DDR SDRAM must be reduced for data determination. This results in a longer test time and increase in manufacturing cost of the synchronous semiconductor memory device.

However, the operation frequency of the externally output data is twice that of the memory array, that is, the externally output data is high in the operation frequency, and therefore the inspection of the synchronous semiconductor memory device requires an expensive tester which can operate at a high speed and is not possible with an inexpensive tester which is low in operation frequency.

SUMMARY OF THE INVENTION

An object of the present invention is to provide a synchronous semiconductor memory device having a test mode suitable for a DDR SDRAM which can be inspected even with an inexpensive tester which is low in operation frequency.

In short, the present invention is a synchronous semiconductor memory device operating in synchronization with an externally applied external clock signal having a prescribed clock period. The synchronous semiconductor memory device includes a data input/output node, a plurality of memory cells and a data output circuit. The data output circuit receives a first data which is read from a first memory cell of a plurality of memory cells and a second data which is read along with the first data from a second memory cell of the plurality of memory cells for outputting them to the data input/output node. The data output circuit successively outputs the first and second data in a first mode, and determines if a prescribed relation between the first and second data is satisfied and outputs a determination result in a second mode.

Therefore, it is a main effect of the present invention to enable inspection even with a tester having a low frequency as read data of the plurality of memory cells are compressed and output at a reduced data rate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a circuit diagram showing a structure of a bank selector 68a.

DESCRIPTION OF THE PREFERRED EMBODIMENTS

Figure 1:
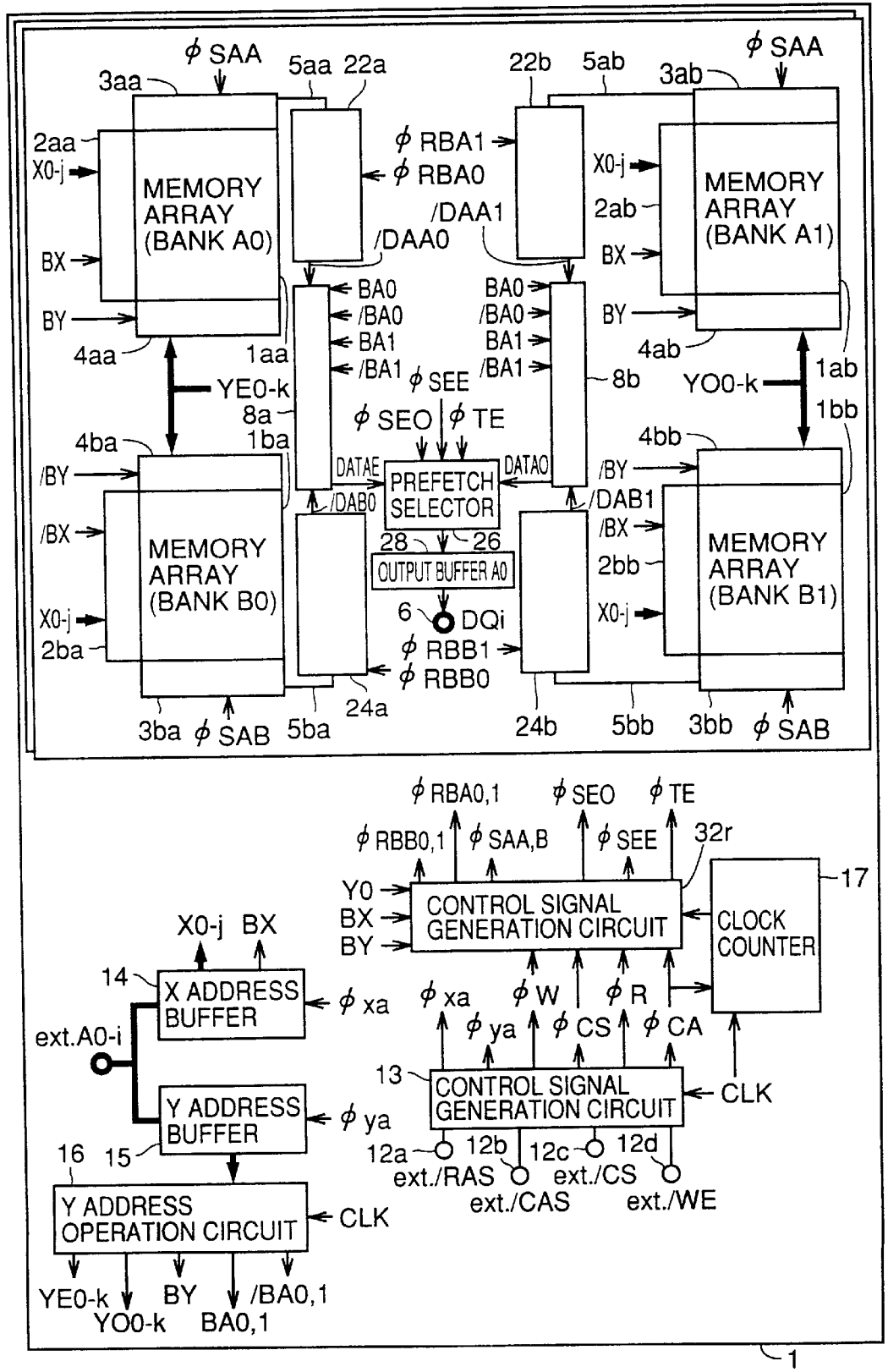
FIG. 1 is a diagram schematically showing a structure of a synchronous semiconductor memory device according to a first embodiment of the present invention.

Embodiments of the present invention will now be described in detail with reference to the drawings. It is noted that the same reference characters in the drawings indicate the same or corresponding portions.

First Embodiment

FIG. 1 shows structures of a portion related to reading of 1-bit data and of a peripheral circuit related to the reading. The portion related to the reading of data is provided corresponding to each of data input/output terminals.

Referring to FIG. 1, a DDR SDRAM includes memory arrays 1aa, 1ab, 1ba and 1bb each having a plurality of memory cells arranged in a matrix.

The SDRAM has two banks, where memory arrays 1aa and 1ab form a bank A and memory arrays 1ba and 1bb form a bank B.

In each of banks A and B, memory arrays 1aa, 1ab, 1ba and 1bb respectively correspond to sub banks A0, A1, B0 and B1.

In a 2-bit prefetch mode, the SDRAM functions as a 2-bank SDRAM. Banks A and B can independently be driven into an active/inactive state. Designation of the bank is performed by a bank address which is applied along with each command.

Provided for memory array 1aa are: a group of X decoders 2aa activated upon activation of a bank address signal BX for decoding row address signals X0–Xj (X0–j) and driving an addressed row of memory array 1aa into a selection state; a group of sense amplifiers 3aa activated upon activation of a sense amplifier activation signal φSAA for detecting, amplifying and latching data for memory cell which is connected to the selected row of memory array 1aa; and a group of Y decoders 4aa activated upon activation of a bank address signal BY for decoding column address signals YE0–YEk (YE0–k) and selecting an addressed column of memory array 1aa.

A memory cell in the column which is selected by a group of Y decoders 4aa is connected to an internal data bus 5aa. Bank address signal BX is applied along with an active command or a precharge command which instructs return to precharge, and bank address signal BY is applied along with a read or write command.

Provided for memory array 1ab are: a group of X decoders 2ab activated upon activation of bank address signal BX for decoding row address signals X0–XJ (X0–j) and driving an addressed row of memory array 1ab into the selection state; a group of sense amplifiers 3ab activated upon activation of sense amplifier activation signal φSAA for detecting, amplifying and latching data for memory cell which is connected to the selected row of memory array 1ab; and a group of Y decoders 4ab activated upon activation of bank address signal BY for decoding column address signals YO0–YOk (YO0–k) and selecting an addressed column of memory array 1ab.

A memory cell in a column which is selected by a group of Y decoders 4ab is connected to an internal data bus 5ab.

Provided for memory array 1ba are: a group of X decoders 2ba activated upon activation of a bank address signal /BX for decoding row address signals X0–Xj (X0–j) and driving an addressed row of memory array 1ba into the selection state; a group of sense amplifiers 3ba activated upon activation of a sense amplifier activation signal φSAB for detecting, amplifying and latching data for memory cell which is connected to the selected row of memory array lba; and a group of Y decoders 4ba activated upon activation of a bank address signal /BY for decoding column address signals YE0–YEk (YE0–k) and selecting an addressed column of memory array 1ba.

A memory cell in the column which is selected by a group of Y decoders 4ba is connected to an internal data bus 5ba.

Provided for memory array 1bb are: a group of X decoders 2bb activated upon activation of bank address signal /BX for decoding row address signals X0–Xj (X0–j) and driving an addressed row of memory array 1bb into the selection state; a group of sense amplifiers 3bb activated upon activation of sense amplifier activation signal φSAB for detecting, amplifying and latching data for memory cell which is connected to the selected row of memory array 1bb; and a group of Y decoders 4bb activated upon activation of bank address signal /BY for decoding column address signals YO0–YOk (YO0–k) and selecting an addressed column of memory array 1bb.

A memory cell in the column which is selected by a group of Y decoders 4bb is connected to an internal data bus 5bb.

Here, the group of X decoders has X decoders arranged corresponding to the rows, the group of sense amplifiers has sense amplifiers arranged corresponding to the columns of a corresponding memory array, and the group of Y decoders has Y decoders arranged corresponding to the columns.

Memory cell selection operations are performed simultaneously in memory array 1aa and 1ab in accordance with bank address signals BX and BY. On the other hand, selection operations are performed simultaneously in memory arrays 1ba and 1bb in accordance with bank address signals BX and /BY.

For reading data from memory array 1aa, a read preamplifier/register 22a is provided which receives and amplifies data from memory array 1aa which is read onto internal data bus 5aa by a group of sense amplifiers 3aa in response to activation of a register activation signal φRBA0.

For reading data from memory array 1ab, a read preamplifier/register 22b is provided which receives and amplifies data from memory array 1ab which is read onto internal data bus 5ab by a group of sense amplifiers 3ab in response to activation of a register activation signal φRBA1.

For reading data from memory array 1ba, a read preamplifier/register 24a is provided which receives and amplifies data from memory array 1ba which is read onto internal data bus 5ba by a group of sense amplifiers 3ba in response to activation of a register activation signal φRBB0.

For reading data from memory array 1bb, a read preamplifier/register 24b is provided which receives and amplifies data from memory array 1bb which is read onto internal data bus 5bb by a group of sense amplifiers 3bb in response to activation of a register activation signal φRBB1.

A bank selector 8a is provided for read preamplifier/registers 22a and 24a. Bank selector 8a selects and outputs one of data signals /DAA0 and /DAB0 which are respectively output from read preamplifier/registers 22a and 24a in accordance with data selection signals BA0, /BA0, BA1 and /BA1.

A bank selector 8b is provided for read preamplifier/registers 22b and 24b. Bank selector 8b selects and outputs one of data signals /DAA1 and /DAB1 which are respectively output from read preamplifier/registers 22b and 24b in accordance with data selection signals BA0, /BA0, BA1 and /BA1.

Provided for bank selectors 8a and 8b are: a prefetch selector 26 selecting a signal from one of bank selectors 8a and 8b in accordance with selection signals φSEO and φSEE; an output buffer 28 receiving and amplifying an output from prefetch selector 26; and a data input/output terminal 6 externally outputting an output signal from output buffer 28.

The synchronous semiconductor memory device further includes a control signal generation circuit 13 incorporating external control signals ext. /RAS, ext. /CAS, ext. /CS and ext. /WE which are respectively applied to input terminals 12a, 12b, 12c and 12d in synchronization with the rise of a clock signal CLK and inverting the states thereof for generating internal control signal φxa, φya, φW, φCS, φR and φCA.

Signal ext. /CS is a chip select signal, and the synchronous semiconductor memory device inputs/outputs data when chip select signal ext. /CS is in an activation state.

Clock signal CLK is internally generated in accordance with an external clock signal ext. CLK.

Signal φxa is activated when an active command is applied and instructs incorporation of a row address signal. Signal φya is activated when the read or write command is applied and instructs incorporation of a column address signal. Signal φW is activated when the write command is applied and instructs data writing. Signal φR is activated when the active command is applied and activates a circuit of a portion which is related to row selection. Signal φCA is activated when the read or write command is applied and activates a circuit of a portion which is related to column selection and data input/output (a column related circuit).

The synchronous semiconductor memory device further includes: an X address buffer 14 incorporating external address signals ext. A0–Ai (A0–i) in response to activation of a row address incorporation instruction signal φxa for generating internal row address signals X0–Xj (X0–j) and bank address signal BX; a Y address buffer 15 activated upon activation of a column address incorporation instruction signal φya for incorporating external address signals ext. A0–Ai and generating an internal column address signal; and a Y address operation circuit 16 changing an address in a prescribed sequence in synchronization with clock signal CLK using the internal column address signal applied from Y address buffer 15 as a leading address for generating even column address signals YE0–YEk (YE0–k), odd column address signals YO0–YOk (YO0–k) and bank address signals BY, BA0, BA1 (BA0, 1), /BA0 and /BA1 (/BA0, 1).

Y address operation circuit 16 includes a burst address counter and changes the column address signal every two clock cycles.

The synchronous semiconductor memory device further includes: a clock counter 17 counting internal clock signal CLK in accordance with activation of column related activation signal φCA for generating a count up signal at a prescribed timing in accordance with the counts value; and control signal generation circuit 32r receiving the count up signal from clock counter 17, bank address signals BX and BY and a least significant bit Y0 of the column address signal for generating various internal control signals φRBB0, φRBB1, φRBA0, φRBA1, φSAA, φSAB, φSE0, φSEE and φTE.

The control signal corresponding to a bank which is designated in accordance with bank address signals BX and BY is brought into the active state. Least significant bit Y0 of the column address signal is used for indicating which of two memory arrays included in one bank should first be accessed.

Clock counter 17 counts a CAS latency and a burst length and generates a count up signal at a prescribed timing in accordance with a designated operation mode.

A circuit related to writing is not shown in FIG. 1.

Figure 2:
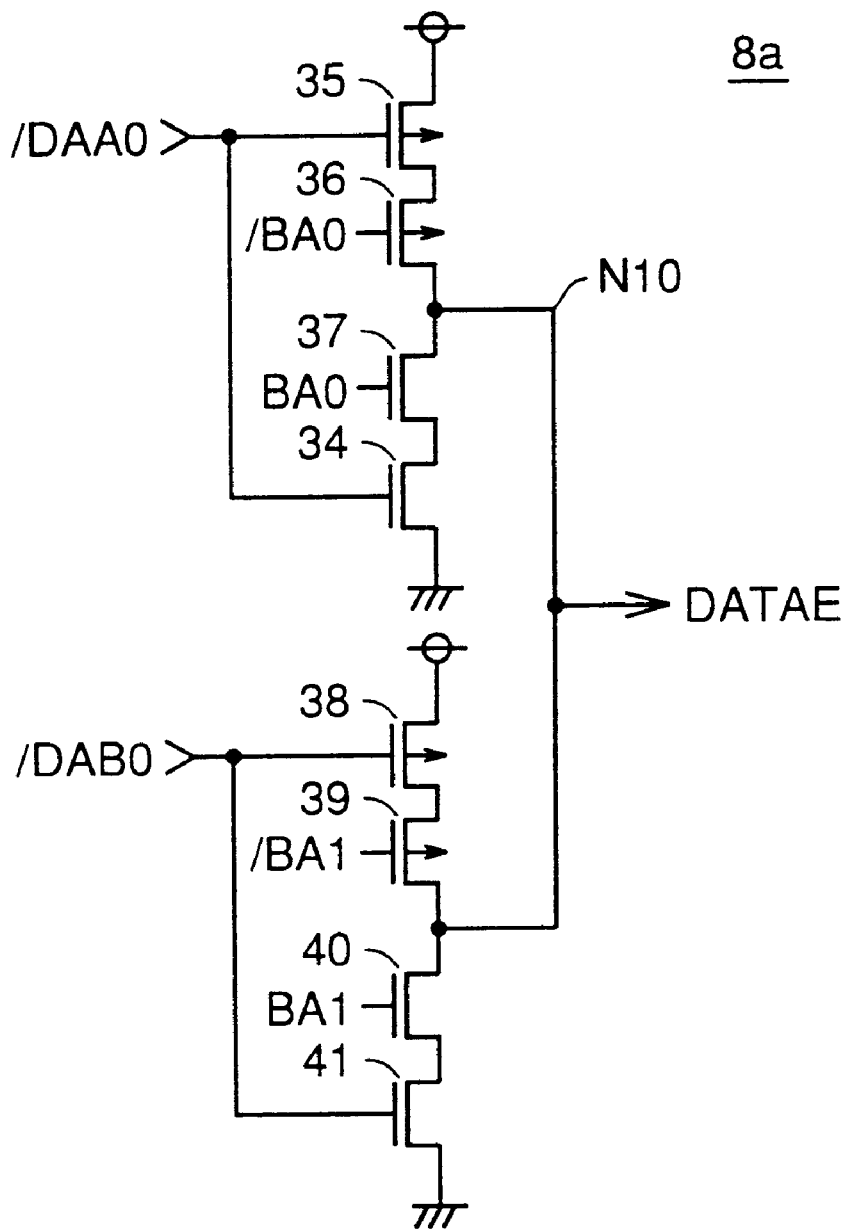
FIG. 2 is a circuit diagram showing an exemplary structure of a bank selector 8a shown in FIG. 1.

Referring to FIG. 2, bank selector 8a includes: P channel MOS transistors 35 and 36 connected in series between a power supply node and a node N10 and having their gates respectively receiving data signal /DAA0 and data selection signal /BA0; N channel MOS transistors 37 and 34 connected in series between node N10 and a ground node and having their gates respectively receiving data selection signal BA0 and data signal /DAA0; P channel MOS transistors 38 and 39 connected in series between a power supply node and node N10 and having their gates respectively receiving data signal /DAB0 and data selection signal /BA1; and N channel MOS transistors 40 and 41 connected in series between node N10 and a ground node and having their gates respectively receiving data selection signal BA1 and data signal /DAB0.

Node N10 is an output node of bank selector 8a, from which a data signal DATAE which is read from the memory array corresponding to an even address is output.

When data selection signal BA0 is activated, bank selector 8a inverts data signal /DAA0 which is read to and latched at read preamplifier/register 22a from memory array 1aa for outputting it as data signal DATAE. When data selection signal BA1 is activated, on the other hand, bank selector 8a inverts data signal /DAB0 which is read to and latched at read preamplifier/register 24a from memory array 1ba for outputting it as data signal DATAE.

Figure 3:
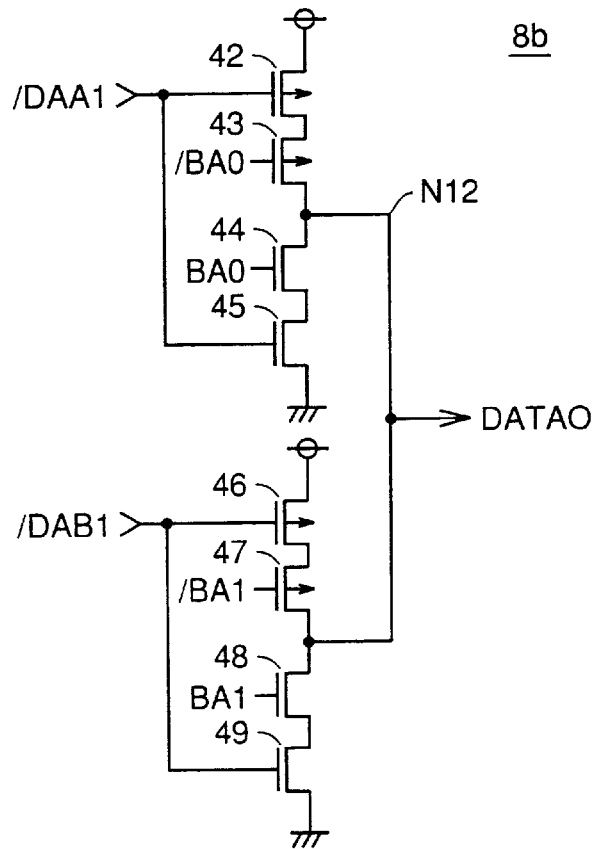
FIG. 3 is a circuit diagram showing an exemplary structure of a bank selector 8b shown in FIG. 1

Referring to FIG. 3, bank selector 8b includes: P channel MOS transistors 42 and 43 connected in series between a power supply node and a node N12 and having their gates respectively receiving data signal /DAA1 and data selection signal /BA0; N channel MOS transistors 44 and 45 connected in series between node N12 and a ground node and having their gates respectively receiving data selection signal BA0 and data signal /DAA1; P channel MOS transistors 46 and 47 connected in series between a power supply node and node N12 and having their gates respectively receiving data signal /DAB1 and data selection signal /BA1; and N channel MOS transistors 48 and 49 connected in series between node N12 and a ground node and having their gates respectively receiving data selection signal BA1 and data signal /DAB1.

Node N12 is an output node of bank selector 8b, from which a data signal DATAO which is read from the memory array corresponding to an odd address is output.

When data selection signal BA0 is activated, bank selector 8b inverts data signal /DAA1 which is read to and latched at read preamplifier/register 22b from memory array 1ab for outputting it as data signal DATAO. When data selection signal BA1 is activated, on the other hand, bank selector 8b inverts data signal /DAB1 which is read to and latched at read preamplifier/register 24b from memory array 1bb for outputting it as data signal DATAO.

Figure 4:
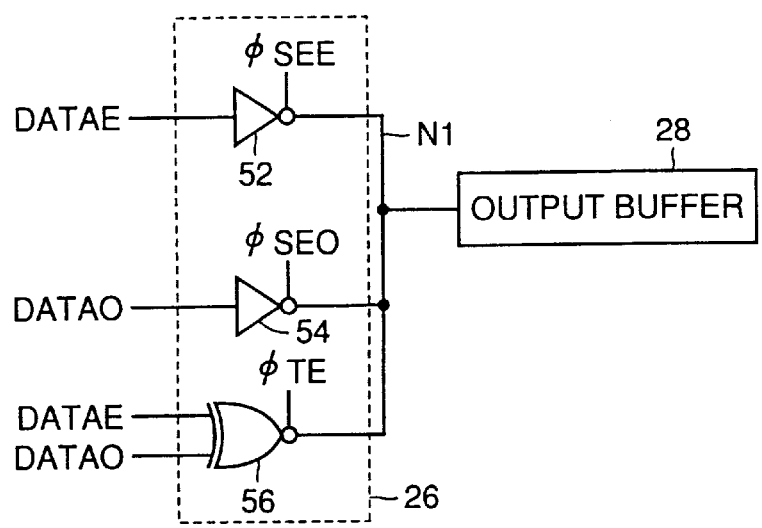
FIG. 4 is a circuit diagram showing a structure of a prefetch selector 26 shown in FIG. 1.

Referring to FIG. 4, prefetch selector 26 includes: an inverter 52 activated in accordance with activation of control signal φSEE for receiving and inverting data signal DATAE and outputting it to node N1; an inverter 54 activated in accordance with activation of control signal φSEO for receiving and inverting data signal DATAO and outputting it to node N1; and an EXNOR circuit 56 activated when a test mode signal φTE is activated for receiving data signals DATAE and DATAO and outputting an exclusive NOR thereof to node N1.

Node N1 is an output node of prefetch selector 26 which outputs a data signal to an output buffer 28.

In a normal operation, data is output to node N1 by inverters 52 and 54. In a test mode, match or mismatch of data signals DATAE and DATAO is output to node N1 by EXNOR circuit 56.

Figure 5:
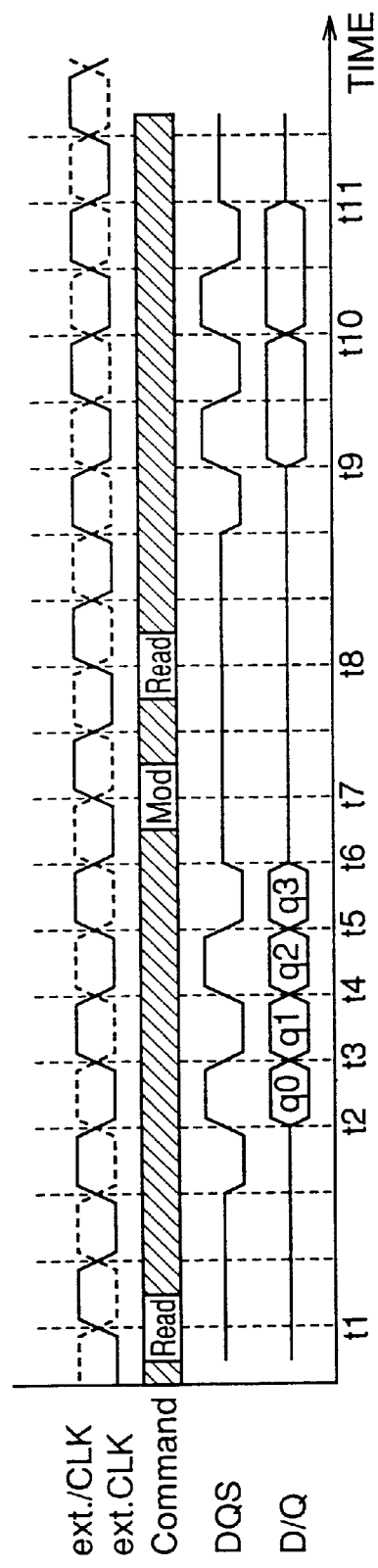
FIG. 5 is a diagram showing operation waveforms used for describing an operation of the synchronous semiconductor memory device according to the first embodiment.

Referring to FIG. 5, a normal reading operation is performed between time t1 and t6, and a reading operation in the test mode is performed between time t7 and t11. At t1, a read command is externally input. Responsively, from t2 to t3, a data q0 read from the memory array is output along with a data strobe signal DQS. From t2 to t6, data q0 to q3 (the number of data corresponds to the burst length) are sequentially output in a period which is half a clock period. In the normal operation, prefetch selector shown in FIG. 4 outputs 2-bit data which is output from the selected bank at a frequency which is twice a clock frequency by alternately activating control signals φSEE and φSEO.

At t7, synchronous semiconductor memory device 1 is brought into the test mode by applying a prescribed command to control terminals 12a to 12d. At t8, the read command is input. Responsively, an output of data which is compressed between t9 and t11 is output to a data terminal in a period which is the same as the clock period.

Figure 6:
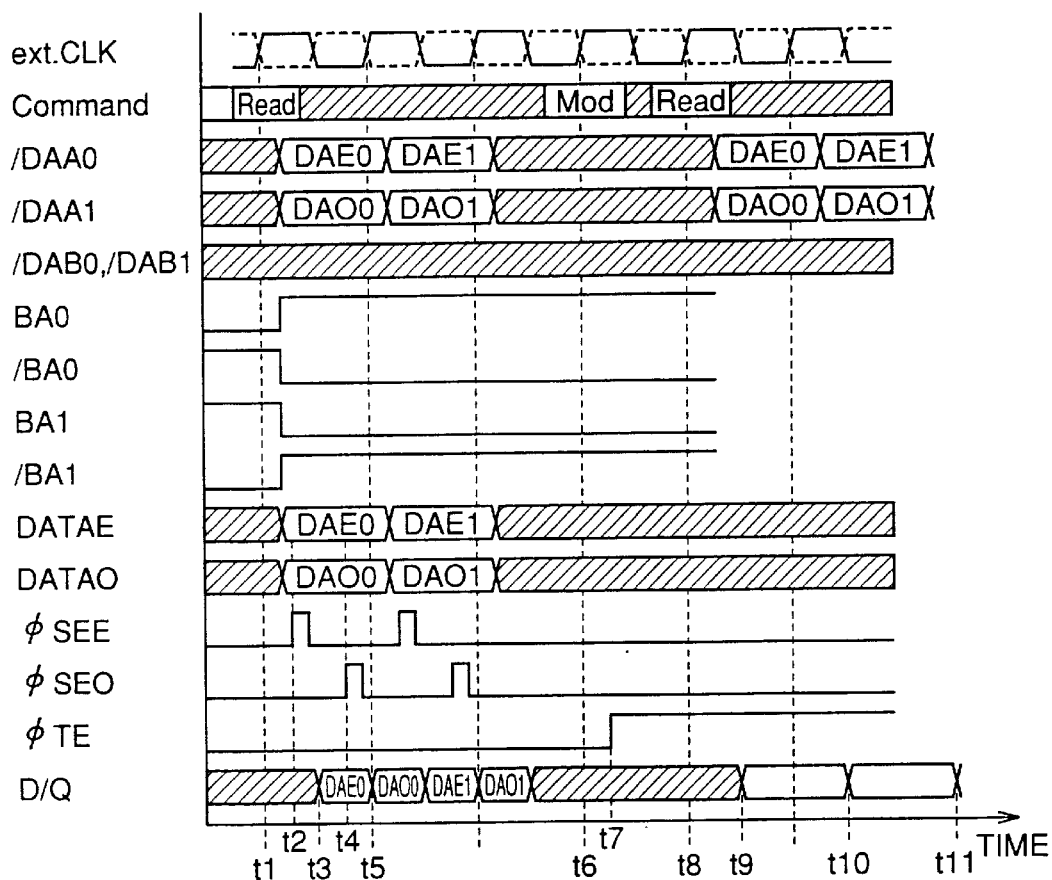
FIG. 6 is a diagram showing operation waveforms used for describing in further detail a reading operation of the synchronous semiconductor memory device shown in FIG. 1.

Referring to FIG. 6, at t1, control signal terminals 12a to 12d are set in a prescribed manner, and the read command is input at the rising edge of external clock signal ext. CLK.

At the time, addresses corresponding to banks A0 and A1 are externally input. Responsively, a data DAE0 is latched at read preamplifier/register 22a from bank A0. Similarly, a data DAO0 is latched at read preamplifier/register 22b from bank A1. On the other hand, data are not read from banks B0 and B1 to read preamplifier/registers 24a and 24b as banks B0 and B1 are not designated Further, data selection signals BA0, /BA0, BA1 and /BA1 which are input to bank selectors 8a and 8b are set to select data output from banks A0 and A1. Thus, data DAE0 and DAO0 are respectively output to prefetch selector 26 from bank selectors 8a and 8b.

At t2, control signal φSEE is activated and, responsively, data DAE0 is output to data output terminal 6 at t3. Then, at t4, control signal φSEO is activated and, responsively, data DAO0 is output to data output terminal 6 at t5. Similarly, a data DAE1 and DAO1 are respectively read fiom banks A0 and A1 and output to data terminal 6 successively. Here, D/Q represents a signal which is read to data terminal 6. In the operation as described above, a frequency at which data is output to data terminal 6 is twice the clock frequency.

At t6, synchronous semiconductor memory device 1 is a set in the test mode in accordance with setting of control signal input terminals 12a to 12d. At t7, test mode signal φTE is brought into the activation state.

At t8, the read command in the test mode is applied in accordance with the setting of control terminals 12a to 12d. Responsively, data DAE0 and DAO0 are respectively read from banks A0 and A1.

At the time, control signals φSEE and φSEO are not activated and test mode signal φTE is in the activation state, so that the exclusive NOR of data DAE0 and DAO0 is output to node N1 in FIG. 4 as an output from the prefetch selector shown in FIG. 4. If the results of read data DAE0 and DAO0 match, the output signal attains to an "H" (High) level and, if not, attains to an "L" (Low) level. Data of the same logic values are preliminary written to banks A0 and A1, and a value output to node N1 should be at the H level if writing or reading of data is normally performed. Accordingly, compressed 2-bit data is output to the data terminal between t9 and t10.

Similarly, from t10 to t11, data obtained by compressing data DAE1 and DAO1 respectively read from banks A0 and A1 is read to the data terminal. In the above mentioned operation in the test mode, the frequency at which data is output to data terminal 6 may be the same as the clock frequency.

As described above, the synchronous semiconductor memory device according to the first embodiment allows compression of two 1-bit data which are respectively read from the banks corresponding to even and odd address regions by the prefetch selector for outputting the compressed data to the data terminal. Therefore, the synchronous semiconductor memory device can be inspected even with a tester having a low frequency for inspection as a data rate of the output data is reduced to half as compared with that in the normal operation.

Second Embodiment

In a second embodiment, a structure is shown which allows increase in data bit number to be compressed.

Figure 7:
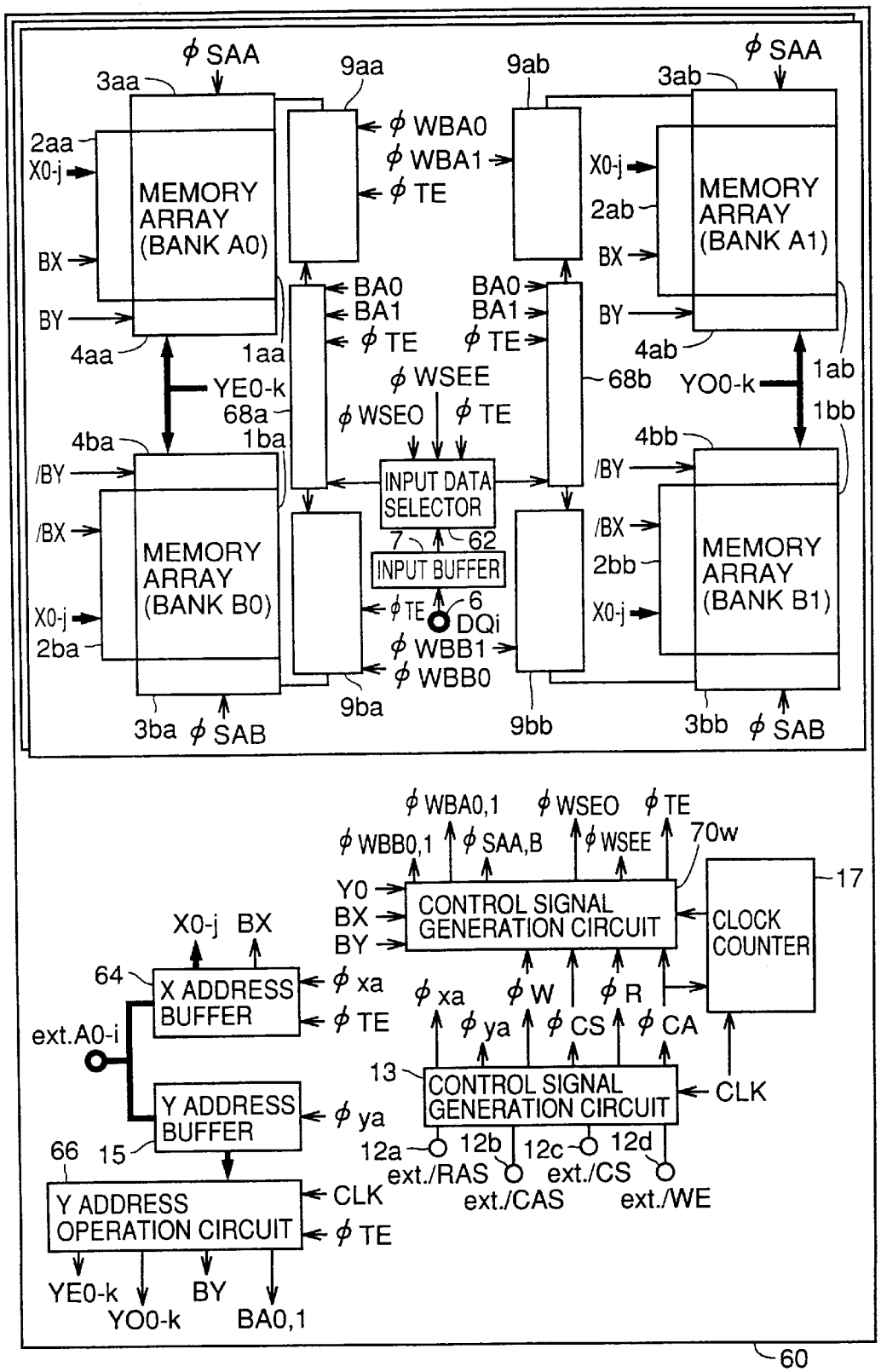
FIG. 7 is a diagram schematically showing a structure of a synchronous semiconductor memory device 60 according to the second embodiment of the present invention.

FIG. 7 shows structures of a portion related to writing of 1-bit data and a peripheral circuit related to the writing. Portions related to data reading are provided corresponding to data input/output terminals.

Referring to FIG. 7, a synchronous semiconductor memory device 60 includes: an input buffer 7 amplifying data which is externally input to a data input/output terminal 6; an input data selector 62 outputting data from input buffer 7 to bank selectors 68a and 68b in accordance with a test mode signal φTE and control signals φWSEO and φWSEE; a bank selector 68a outputting data received from input data selector 62 to write drivers 9aa and 9ba in accordance with test mode signal φTE and data selection signals BA0 and BA1; a write driver 9aa outputting data applied from bank selector 68a to a group of sense amplifiers 3aa in accordance with test mode signal φTE and control signal φWBA0; and a write driver 9ba outputting a signal applied from bank selector 68a to a group of sense amplifiers 3ba in accordance with test mode signal φTE and control signal φWBB0.

Synchronous semiconductor memory device 60 further includes: a bank selector 68b outputting data received from input data selector 62 to write drivers 9ab and 9bb in accordance with test mode signal φTE and data selection signals BA0 and BA1; a write driver 9ab outputting data applied from bank selector 68b to a group of sense amplifiers 3ab in accordance with test mode signal φTE and control signal φWBA1; and a write driver 9bb outputting a signal applied from bank selector 68b to a group of sense amplifiers 3bb in accordance with test mode signal φTE and control signal φWBB1.

As the structures of the memory array and the groups of sense amplifiers, X decoders and Y decoders are the same as in the first embodiment, and therefore the description thereof will not be repeated.

Synchronous semiconductor memory device 60 further includes a control signal generation circuit 13 incorporating external control signals ext. /RAS, ext. /CAS, ext. /CS and ext. /WE which are respectively applied to input terminals 12a, 12b, 12c and 12d in synchronization with the rise of a clock signal CLK and inverting the states thereof for generating internal control signals φxa, φya, φW, φCS, φR and φCA.

Synchronous semiconductor memory device 60 further includes: a clock counter 17 counting an internal clock signal CLK in accordance with activation of a column related activation signal φCA for generating a count up signal at a prescribed timing in accordance with the count value; and a control signal generation circuit 70w receiving the count up signal from clock counter 17, bank address signals BX and BY and a least significant bit Y0 of a column address signal for generating various internal control signals φWBB0, φWBB1, φWBA0, φWBA1, φWSEO, φWSEE and test mode signal φTE.

Synchronous semiconductor memory device 60 further includes an X address buffer 64, a Y address buffer 15 and a Y address operation circuit 66. X address buffer 64 differs from that in the first embodiment in that test mode signal φTE is input thereto and also to Y address operation circuit 66.

Figure 8:
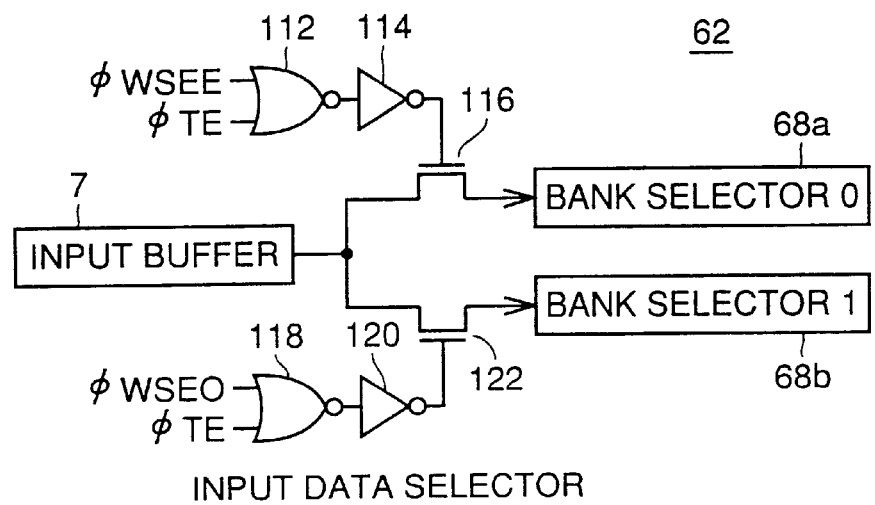
FIG. 8 is a circuit diagram showing a structure of an input data selector 62 in FIG. 7.

Referring to FIG. 8, input data selector 62 includes: NOR circuit 112 receiving control signal φWSEE and test mode signal φTE; an inverter 114 receiving and inverting an output from NOR circuit 112; and an N channel MOS transistor 116 having its gate receiving an output from inverter 114 for transmitting a data signal applied from input buffer 7 upon activation of the output signal from inverter 114 to bank selector 68a.

Input data selector 62 further includes: an NOR circuit 118 receiving control signal φWSEO and test mode signal φSTE; an inverter 120 receiving and inverting an output from NOR circuit 118; and an N channel MOS transistor 122 having its gate receiving an output from inverter 120 for transmitting a data signal applied from input buffer 7 upon activation of the output signal from inverter 120 to bank selector 68b.

Figure 9:
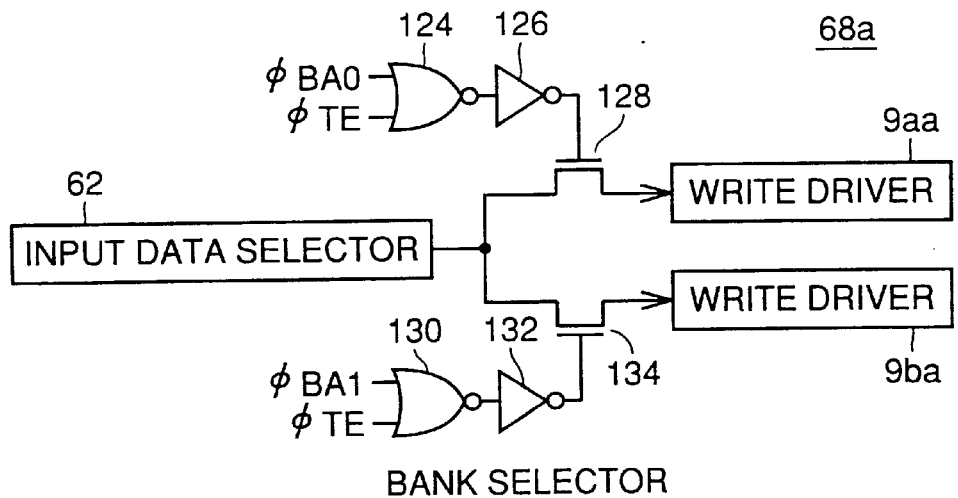

Referring to FIG. 9, bank selector 68a includes: an NOR circuit 124 receiving data selection signal φBA0 and test mode signal φTE; an inverter 126 receiving and inverting an output from NOR circuit 124; and an N channel MOS transistor 128 transmitting a signal applied from input data selector 62 upon activation of the output signal from inverter 126 to write driver 9aa.

Bank selector 68a further includes: an NOR circuit 130 receiving data selection signal φBA1 and test mode signal φTE; an inverter 132 receiving and inverting an input from NOR circuit 130; and an N channel MOS transistor 134 transmitting a signal applied from input data selector 62 upon activation of the output signal from inverter 132 to write driver 9ba.

Figure 10:
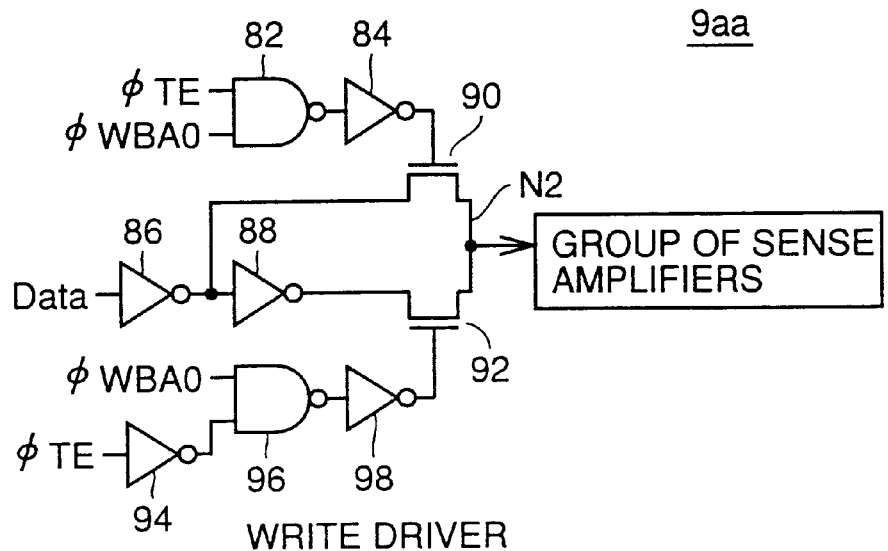
FIG. 10 is a circuit diagram showing a structure of a write driver 9aa in FIG. 7.

Referring to FIG. 10, write driver 9aa includes: an NAND circuit 82 receiving test mode signal φTE and control signal φWBA0; and inverter 84 receiving and inverting an output from NAND circuit 82; an inverter 94 receiving and inverting test mode signal φTE; an NAND circuit 96 receiving an output signal from inverter 94 and control signal φWBA0; and an inverter 98 receiving and inverting an output from NAND circuit 96.

Write driver 9aa further includes: an inverter 86 receiving and inverting data applied from the bank selector; an inverter 88 further inverting an output from interter 86; an N channel MOS transistor 90 applying an output signal from inverter 86 to node N2 upon activation of an output signal of inverter 84; and an N channel MOS transistor 92 applying an output signal from inverter 88 to node N2 upon activation of an output signal from inverter 98. Node N2 corresponding to an output node of write driver 9aa, and an output from write driver 9aa is output to a group of sense amplifiers.

Figure 11:
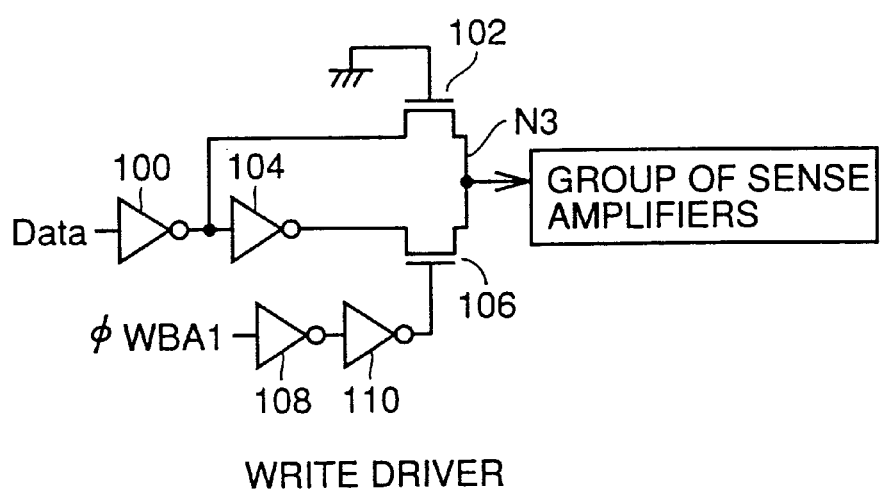
FIG. 11 is a circuit diagram showing a structure of a write driver 9ab in FIG. 7.

Referring to FIG. 11, write driver 9ab includes: an inverter 108 receiving and inverting control signal φWBA1; an inverter 110 receiving and inverting an output from inverter 108; an inverter 100 receiving and inverting data applied from the bank selector; an inverter 104 receiving and inverting an output from inverter 100; and an N channel MOS transistor 102 having its gate receiving a ground potential and connected between an output node of inverter 100 and a node N3; and N channel MOS transistor 106 applying an output signal from inverter 104 to node N3 upon activation of an output from inverter 110. Node N3 is an output node of write driver 9ab, and an output fiom write driver 9ab is output to the group of sense amplifiers.

To briefly described a writing operation, in the normal operation when test mode signal φTE is at an L level, input data selector 62 shown in FIG. 8 transmits data to bank selectors 68a and 68b provided corresponding to even and odd addresses in accordance with control signals φWSEO and φWSEE. On the other hand, in the test mode when test mode signal φTE is at an H level, N channel MOS transistors 116 and 122 are both brought into a conductive state, so that both of bank selectors 68a and 68b receive data.

Although bank selector 68a transmits data to one of write drivers 9aa and 9ba in accordance with data selection signals φBA0 and φBA1 in the normal operation, N channel MOS transistors 128 and 134 in FIG. 9 are both brought into the conductive state in the test mode, so that data are output to both of write drivers 9aa and 9ba.

In the normal operation, data output to write driver 9aa shown in FIG. 10 is applied to a group of sense amplifiers 3aa through N channel MOS transistor 92 and written to the memory array. In the test mode, however, data inverted through N channel MOS transistor 90 is applied to the group of sense amplifiers, so that an inverted data is written to the memory array.

On the other hand, in FIG. 11, an output from the bank selector to the group of sense amplifiers is always applied through N channel MOS transistor 106, and the data is not inverted.

As described above, in the test mode, the inverted data of the data which is written to the bank corresponding to the odd address is written to the bank corresponding to the even address through write driver 9aa.

Bank selector 68b and write drivers 9ba and 9bb have structures which are respectively similar to those of bank selector 68a and write drivers 9aa and 9ab, and therefore the description thereof will not be repeated.

Figure 12:
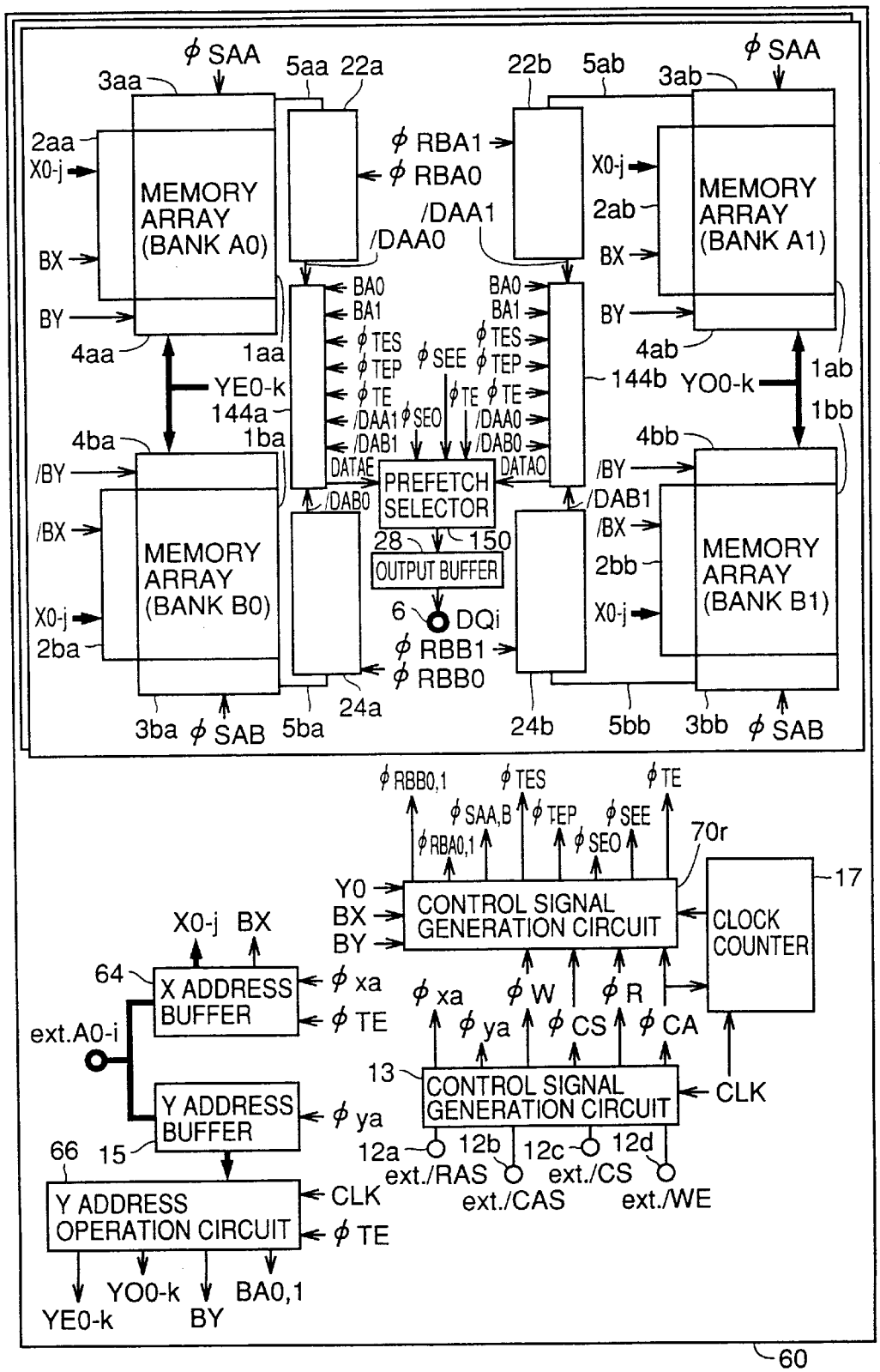
FIG. 12 is a diagram schematically showing structures of a portion related to reading of 1-bit data and a peripheral circuit related to the reading of synchronous semiconductor memory device 60.

FIG. 12 is a diagram schematically showing structures of a portion related to data reading of 1-bit data and a peripheral circuit related to the reading of synchronous semiconductor memory device 60. Portion related to the reading of the data are provided corresponding to each of data input/output terminal.

Referring to FIG. 12, synchronous semiconductor memory device 60 includes bank selectors 144a and 144b in place of bank selectors 8a and 8b, and a prefetch selector 150 in place of prefetch selector 2b. In addition, synchronous semiconductor memory device 60 includes a control signal generation circuit 70r, an X address buffer 64 and a Y address operation circuit 66 in place of control signal generation circuit 32r, X address buffer 14 and Y address operation circuit 16, respectively. In this respect, synchronous semiconductor memory device 60 of the present embodiment differs from that of the first embodiment.

Other parts of the structure are the same as those of the circuit related to reading of synchronous semiconductor memory device 1 shown in FIG. 1, and therefore the description thereof will not be repeated.

X address buffer 64 includes a bank address output portion 146.

Figure 13:
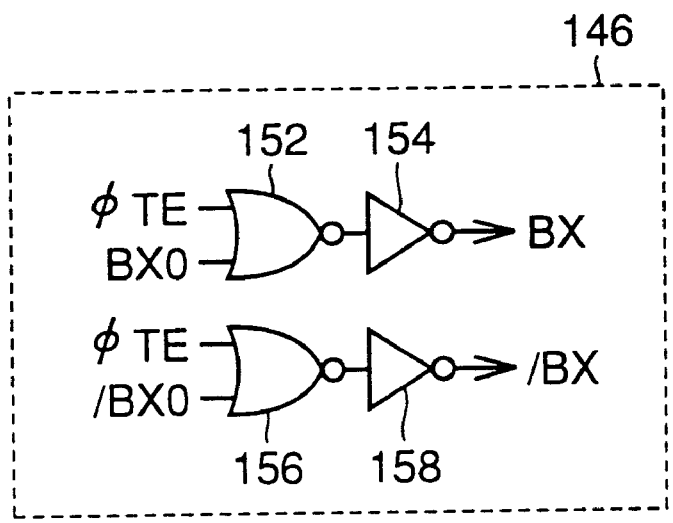
FIG. 13 is a circuit diagram showing a structure of a bank address output portion 146 included in an X address buffer 64 shown in FIG. 12.

Referring to FIG. 13, bank address output portion 146 includes: an NOR circuit 152 receiving test mode signal φTE and bank address signal BX0; an inverter 154 receiving and inverting an output from NOR circuit 152 for outputting bank address signal BX; an NOR circuit 156 receiving test mode signal φTE and bank address signal /BX0; and an inverter 158 receiving and inverting an output fiom NOR circuit 156 for outputting bank address signal /BX.

Thus, when test mode signal φTE is at the H level, bank address output portion 146 brings both of bank address signals BX and /BX to the H level.

Y address operation circuit 66 in FIG. 12 includes a bank address output portion 148.

Figure 14:
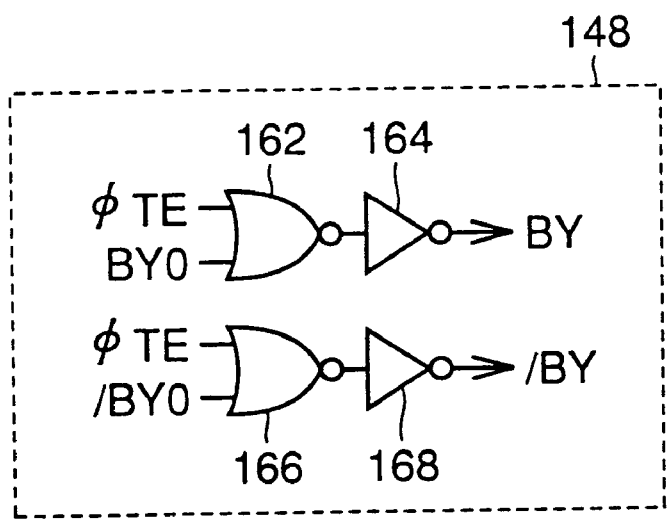
FIG. 14 is a circuit diagram showing a structure of a bank address output portion 148 included in a Y address operation circuit 66 in FIG. 12.

Referring to FIG. 14, bank address output portion 148 includes: an NOR circuit 162 receiving test mode signal φTE and bank address signal BY0; an inverter 164 receiving and inverting an output from NOR circuit 162 for outputting bank address signal BY; an NOR circuit 166 receiving test mode signal φTE and bank address signal /BY0; and an inverter 168 receiving and inverting an output from NOR circuit 166 for outputting bank address signal /BY.

When test mode signal φTE is at the H level, bank address output portion 148 brings both of bank address signals BY and /BY to the H level.

Figure 15:
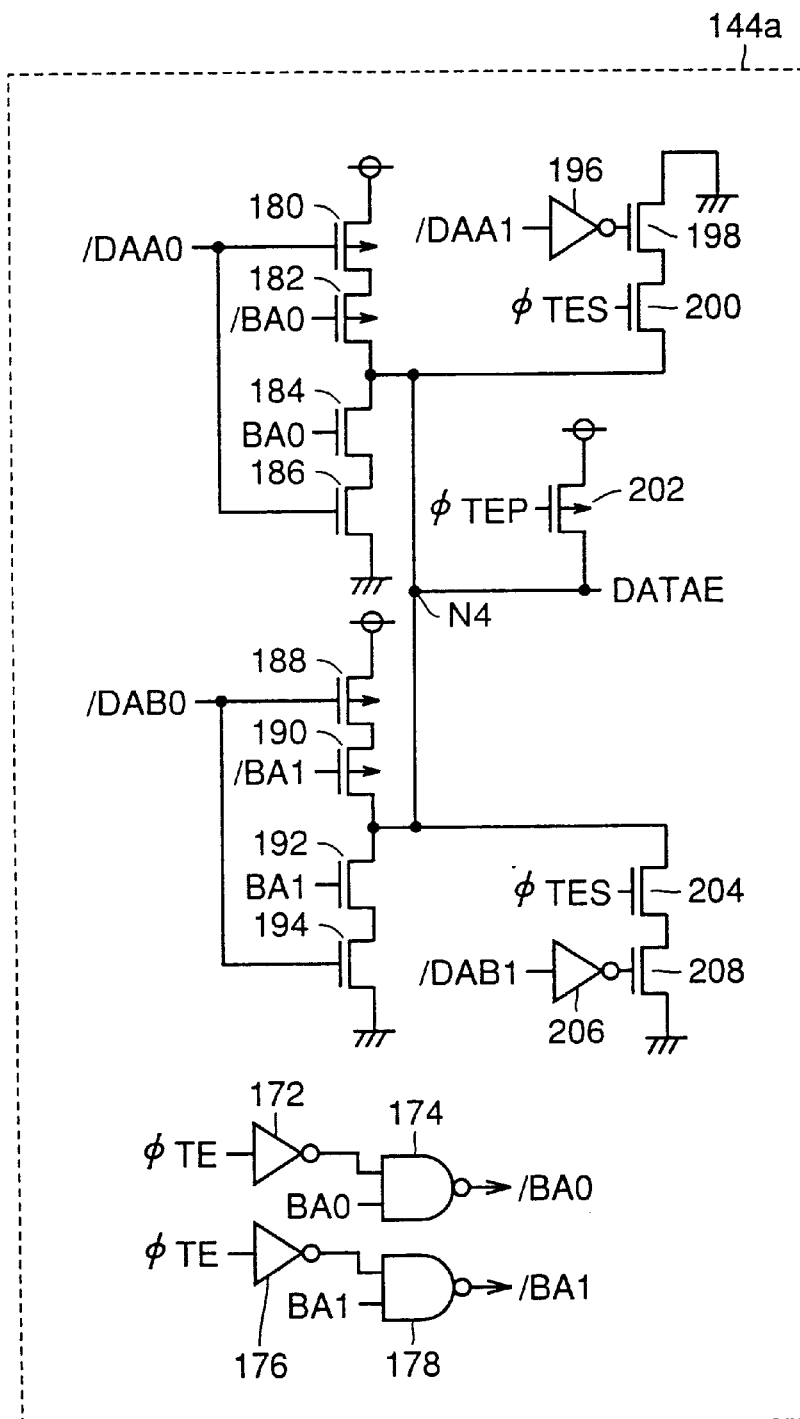
FIG. 15 is a circuit diagram showing a structure of a bank selector 144a in FIG. 12.

Referring to FIG. 15, a bank selector 144a includes: P channel MOS transistors 180 and 182 connected in series between a power supply node and a node N4 and having their gates respectively receiving data signal /DAA0 and data selection signal /BA0; N channel MOS transistors 184 and 186 connected in series between node N4 and a ground node and having their gates respectively receiving data selection signal BA0 and data signal /DAA0; P channel MOS transistors 188 and 190 connected in series between a power supply node and node N4 and having their gates respectively receiving data signal /DAB0 and data selection signal /BA1; and N channel MOS transistors 192 and 194 connected in series between node N4 and a ground node and having their gates respectively receiving gate selection signal BA1 and data signal /DAB0.

Bank selector 144a further includes: a P channel MOS transistor 202 connected between a power supply node and node N4 and having its gate receiving a signal STEP; an inverter 196 receiving and inverting data signal /DAA1; an N channel MOS transistors 200 and 198 connected in series between node N4 and a ground node and having their gates respectively receiving a signal φTES and an output from inverter 196; an inverter 206 receiving and inverting data signal /DAB1; and N channel MOS transistors 204 and 208 connected in series between node N4 and a ground node and having their gates receiving signal φTES and an output from inverter 206.

Bank selector 144a further includes: an inverter 172 receiving and inverting test mode signal φTE; an NAND circuit 174 receiving an output from inverter 172 and data selection signal BA0 for outputting data selection signal /BA0; an inverter 176 receiving and inverting test mode signal φTE; and an NAND circuit 178 receiving an output from inverter 176 and data selection signal BA1 for outputting data selection signal /BA1.

Node N4 is an output node of bank selector 144a, and bank selector 144a outputs a data signal DATAE from node N4.

Here, signal φTEP is a precharge signal which precharges node N4 in the test mode, and signal φTES activates N channel MOS transistors 200 and 204 for decreasing a potential at node N4 to a ground potential in accordance with data signals /DAA1 and /DAB1.

For bank selector 144a, when test mode signal φTE is at the H level, data selection signals /BA0 and /BA1 are fixed at the H level by the functions of NAND circuits 174 and 178. Thus, P channel MOS transistors 182 and 190 are brought into non-conductive state in the test mode. Accordingly, in the test mode, bank selector 144a becomes a circuit in which drains of the four transistors respectively having their gates receiving data signals /DAA1, /DAB0, and inverted signals of data signals /DAA1 and /DAB1 are wired-OR-connected.

Figure 16:
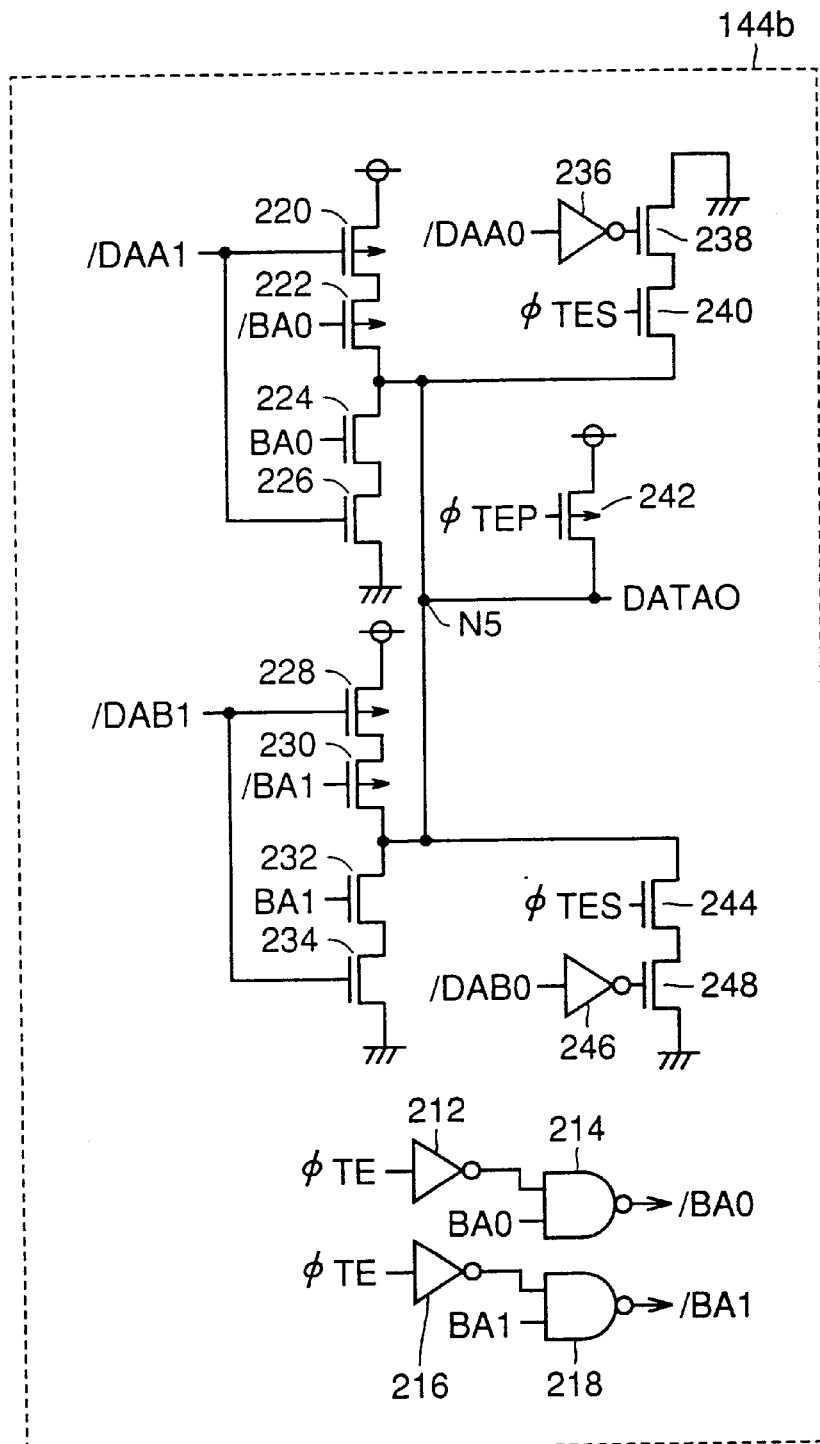
FIG. 16 is a circuit diagram showing a structure of a bank selector 144b in FIG. 12.

Referring to FIG. 16, bank selector 144b includes: P channel MOS transistors 220 and 222 connected in series between a power supply node and a node N 5 and having their gates receiving respectively receiving data signal /DAA1 and data selection signal /BA0; N channel MOS transistors 224 and 226 connected in series between node N5 and a ground node and having their gates respectively receiving data selection signal BA0 and data signal /DAA1; P channel MOS transistors 228 and 230 connected in series between a power supply node and node N5 and having their gates respectively receiving data signal /DAB1 and data selection signal /BA1; and N channel MOS transistors 232 and 234 connected in series between node N5 and a ground node and having their gates respectively receiving data selection signal BA1 and data signal /DAB1.

Bank selector 144b further includes: a P channel MOS transistor 242 connected between a power supply node and node N5 and having its gate receiving a signal φTEP; an inverter 236 receiving and inverting data signal /DAA0; N channel MOS transistors 240 and 238 connected in series between node N5 and a ground node and having their gates respectively receiving signal φTES and an output from inverter 236; an inverter 246 receiving and inverting data signal /DAB0; and N channel MOS transistors 244 and 248 connected in series between node N5 and a ground node and having their gates respectively receiving signal φTES and an output from inverter 246.

Bank selector 144b further includes: an inverter 212 receiving and inverting test mode signal φTE; an NAND circuit 214 receiving an output from inverter 212 and data selection signal BA0 for outputting data selection signal /BA0; an inverter 216 receiving and inverting test mode signal φTE; and an NAND circuit 218 receiving an output from inverter 216 and data selection signal BA1 for outputting data selection signal /BA1.

Node N5 is an output node of bank selector 144b, and bank selector 144b outputs a data signal DATA0 from node N5.

Here, signal φTEP is a precharge signal precharging node N5 in the test mode, and signal φTES activates N channel MOS transistors 240 and 244 for decreasing a potential at precharged node N5 in accordance with data signals /DAA0 and /DAB0.

For bank selector 144b, when test mode signal φTE is at the H level, data selection signals /BA0 and /BA1 are fixed at the H level by the functions of NAND circuits 214 and 218. Thus, P channel MOS transistors 222 and 230 are brought into the non-conductive state in the test mode. Accordingly, in the test mode, bank selector 144b becomes a circuit in which drains of the four transistors respectively having their gates receiving data signals /DAA1, /DAB1 and inverted signals of data signals /DAA0, /DAB0 are wired-OR-connected.

Figure 17:
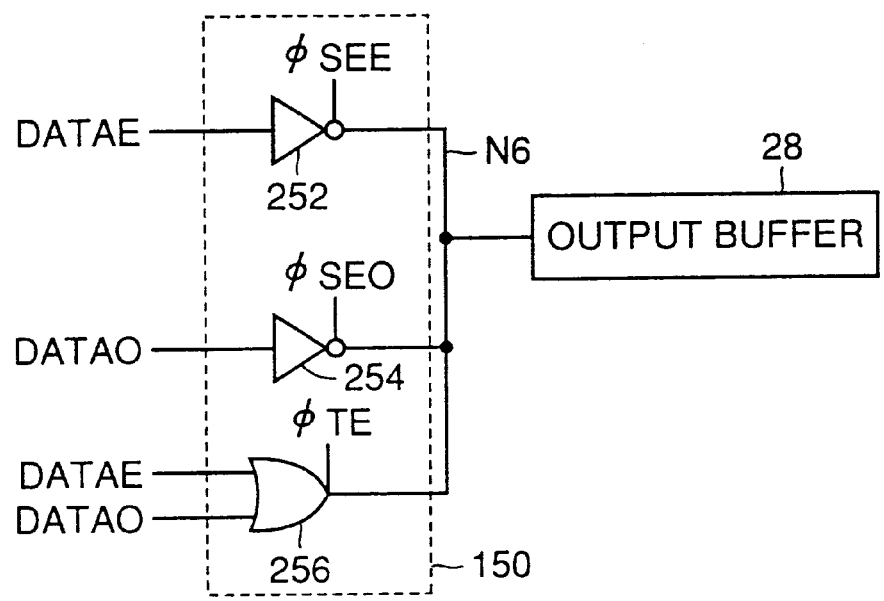
FIG. 17 is a circuit diagram showing a structure of a prefetch selector 150 in FIG. 12.

Referring to FIG. 17, prefetch selector 150 includes: an inverter 252 receiving and inverting data signal DATAE upon activation of control signal φSEE for outputting it to a node N6; an inverter 254 receiving and inverting data signal DATA0 upon activation of control signal φSEO for outputting it to node N 6; and an OR circuit 256 receiving data signals DATAE and DATAO upon activation of test mode signal φTE for outputting an OR thereof to node N6.

Node N 6 is an output node of prefetch selector 150, and an output signal from prefetch selector 150 is applied to output buffer 28 from node N6.

The data written to bank A0 is the same as that written to bank B0. The data written to bank A1 is the same as that written to bank B1. Further, data of inverted value of data written to banks A1 and B1 are also written to banks A0 and B0.

Figure 18:
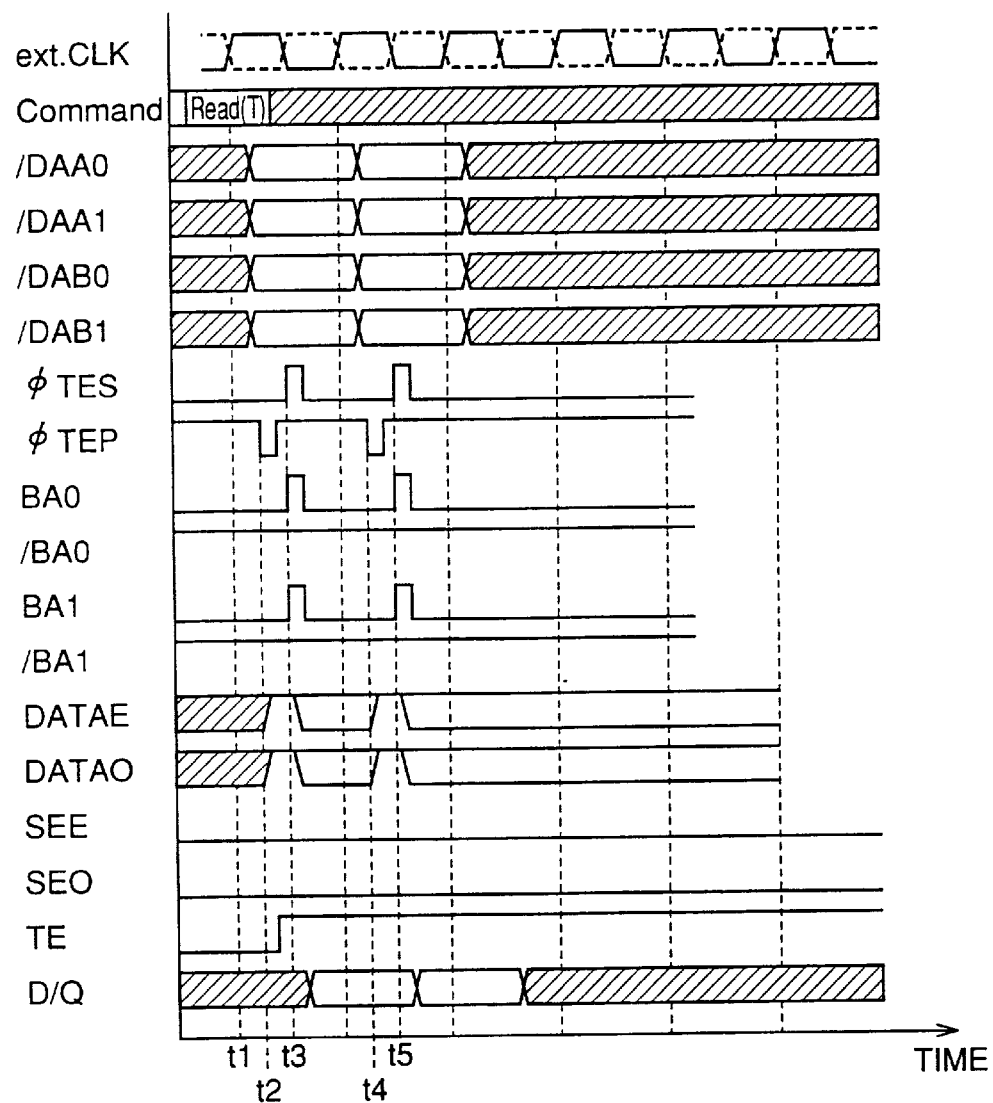
FIG. 18 is a diagram showing operation waveforms used for describing a reading operation in a test mode.
Figure 19:
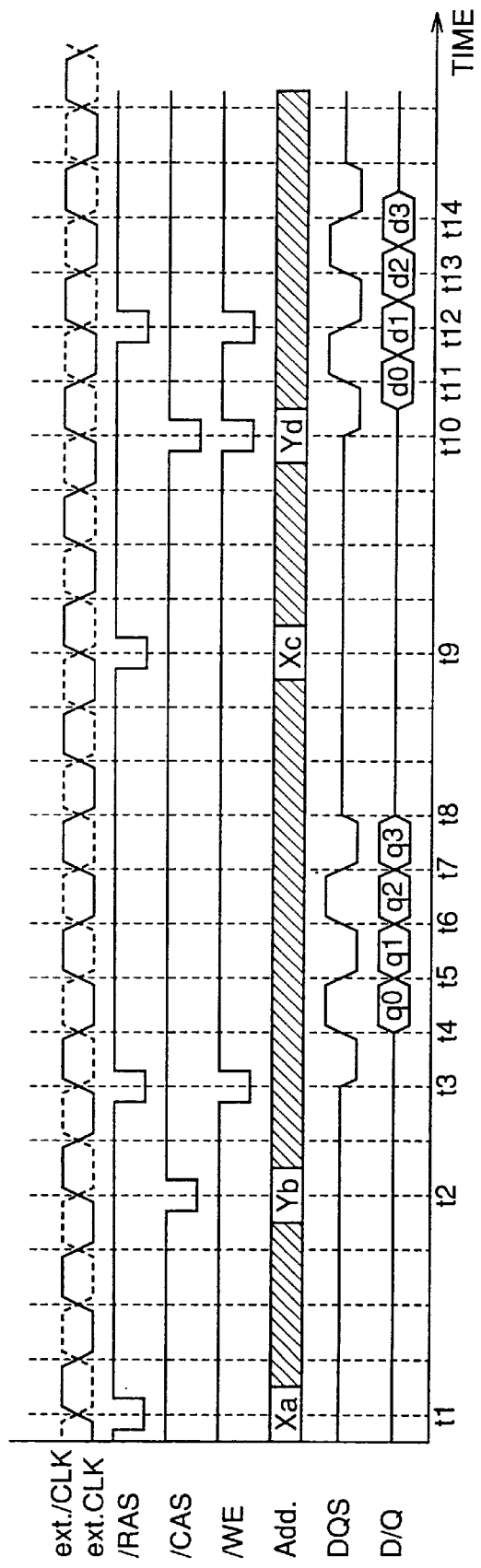
FIG. 19 is a diagram showing operation waveforms corresponding to an operation at the time of accessing for DDR SDRAM.
Figure 20:
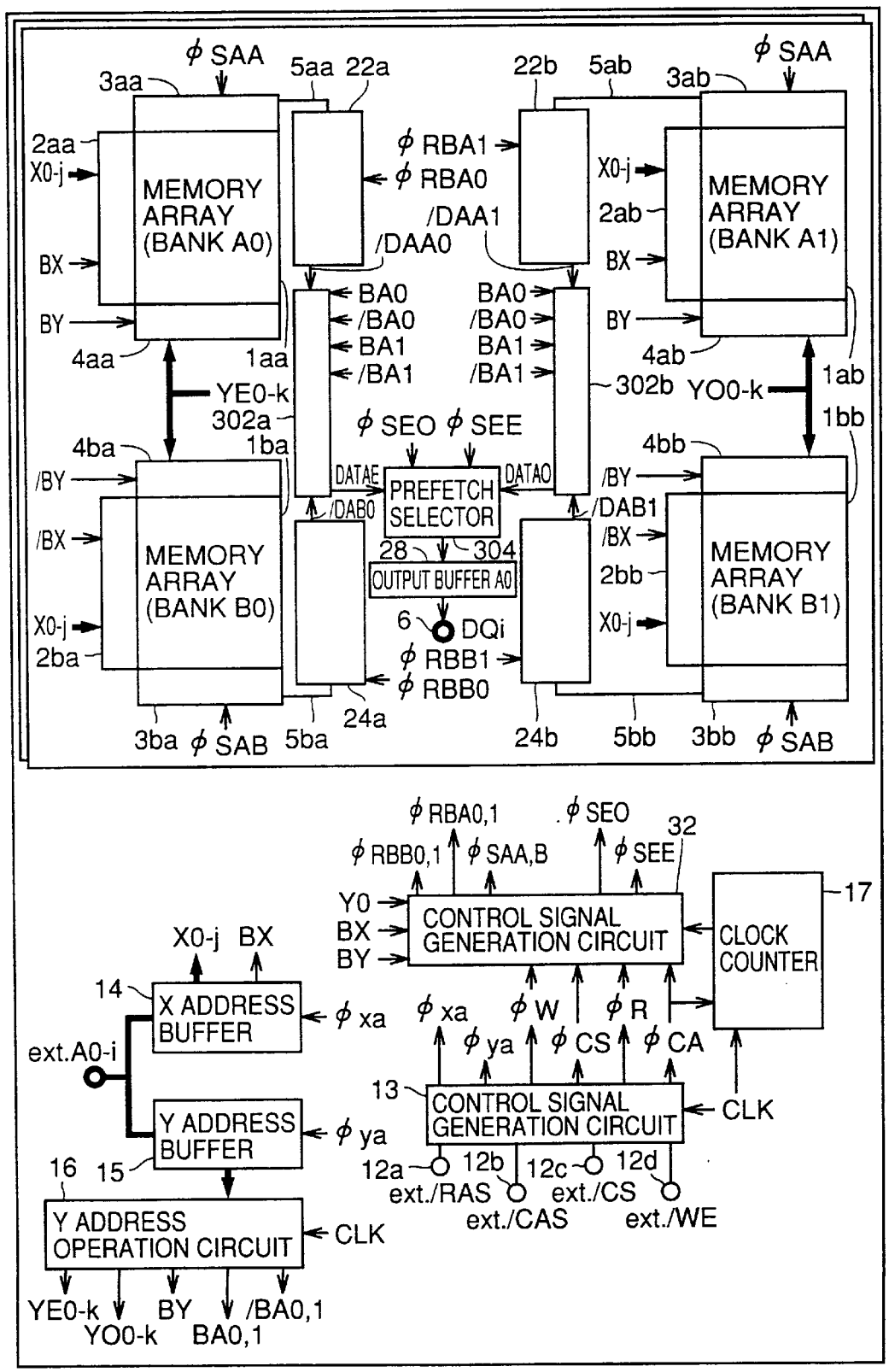
FIG. 20 is a diagram schematically showing a structure of a DDR SDRAM having a 2-bit prefetch mode.
Figure 21:
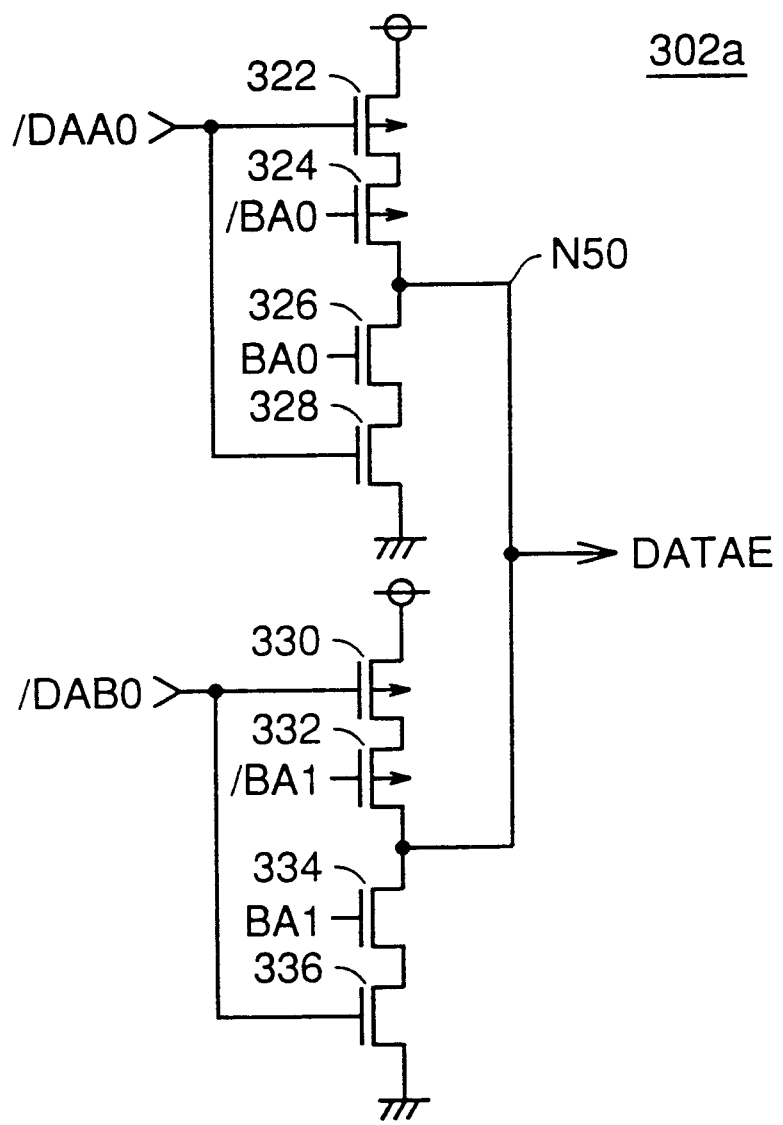
FIG. 21 is a circuit diagram showing an exemplary structure of a bank selector 302a in FIG. 20.
Figure 22:
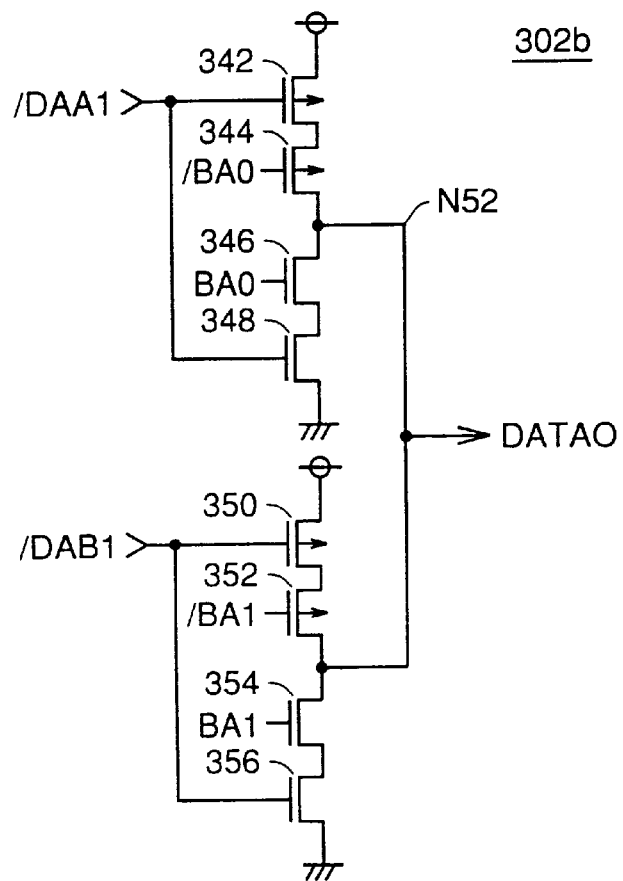
FIG. 22 is a circuit diagram showing an exemplary structure of a bank selector 302b in FIG. 20.
Figure 23:
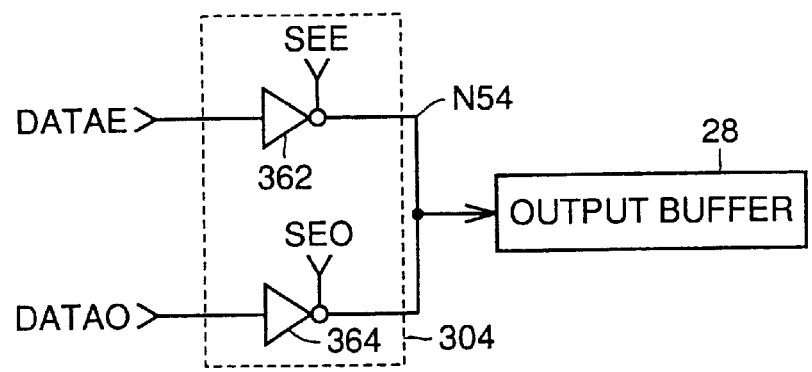
FIG. 23 is a circuit diagram showing an exemplary structure of a prefetch selector 304 in FIG. 20.

Referring to FIG. 18, at a time t1, a read command is input in the test mode. After the command is input, data signals /DAA0, /DAA1, /DAB0 and /DAB1 are respectively read from banks A0, A1, B0 and B1.

At a time t2, nodes N4 and N5 respectively in FIGS. 15 and 16 are precharged in accordance with a change of precharge signal φTEP.

At a time t3, signal φTES and data selection signals BA0 and BA1 are activated after the precharge operation is completed. Responsively, an NOR of data signals /DAA0 and /DAB0 and inverted signals of data signals /DAA1 and /DAB1 is output to output signal DATAE from bank selector 144a shown in FIG. 15. Similarly, an NOR of data signals /DAA1 and /DAB1 and inverted signals of data signals /DAA0 and /DAB0 is output to data signal DATAO from bank selector 144b shown in FIG. 14. An OR of data signals DATAE and DATAO is obtained by logic operation in prefetch selector 150 and output to a data input/output terminal through the output buffer.

Here, a signal D/Q is a data which represents a test result output to data input/output terminal 6. The data is a signal which attains to the L level only when all of data are normally read from banks A0, A1, B0 and B1.

The synchronous semiconductor memory device according to the second embodiment further compresses data and outputs the result as compared with that of the first embodiment. However, if data is simply compressed, the scale of the circuit increases. In other words, an area occupied by the circuit increases as all of data lines should be connected to the circuit.

In the synchronous semiconductor memory device according to the second embodiment, a data line of 2-bit prefetch mode is employed in order to achieve compression of data while reducing the increase in the chip real estate. The wired OR can be output by adding a transistor for precharging to the bank selector utilizing the structure which is used for the normal operation of the bank selector.

Signal φTEP is activated and data signals DATAE and DATAO are precharged to the H level. After signal φTEP is brought into an inactive state, signal φTES and data selection signals BA0 and BA1 are activated.

Here, if data signals /DAA0, /DAB0 and data signals /DAA1, /DAB1 are respectively at the H and L levels, for example, data signal DATAE attains to the L level and data signal DATAO is maintained at the H level. At the time, when at least one data signal is erroneously read to the bank selector, both of data signals DATAE and DATAO, which are output signals from the bank selector, attain to the L level. Thus, if one of data signals DATAE and DATAO is at the L level and the other is at the H level, it means that the data are normally read. When both of data signals DATAE and DATAO are at the L level, it means that the data is erroneously read for one of the memory cells. When the data is read through an OR circuit in prefetch selector circuit 150, the H and L levels of the output signal respectively represents "pass" and "fail".

As described above, in the synchronization semiconductor memory device according to the second embodiment, the number of circuits to be added is reduced by utilizing the data line of 2-bit prefetch mode, whereby a test mode is achieved which allows further compression of data and inspection even with an inexpensive tester of a short inspection time and a low operation frequency while preventing increase in the chip real estate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device operating in synchronization with an external clock signal having a prescribed clock period, comprising:
   a data input/output node;
   a plurality of memory cells; and
   a data output circuit receiving first and second data read in a group from first and second memory cells out of said plurality of memory cells for outputting said first and second data to said data input/output node,
   said data output circuit sequentially outputting said first and second data in a normal operation mode and determining whether a prescribed relation between said first and second data is obtained for outputting a determination result in a test mode.

2. The synchronous semiconductor memory device according to claim 1, wherein said data output circuit further includes:
   a selection circuit activated in said normal operation mode for sequentially outputting said first and second data to said data input/output node in one period of said clock period; and
   a data processing circuit activated in said test mode for outputting said determination result in said one period of said clock period.

3. The synchronous semiconductor memory device according to claim 1, wherein said data output circuit includes:
   a selection circuit activated in said normal operation mode for selecting one of said first and second data in accordance with a control signal and sequentially outputting said first and second data to said data input/output node in one period of said clock period; and
   a data processing circuit activated in said test mode for outputting a result as to match of said first and second data to said data input/output node in said one period of said clock period.

4. The synchronous semiconductor memory device according to claim 3, wherein said data processing circuit includes a gate circuit outputting an exclusive NOR of said first and second data.

5. The synchronous semiconductor memory device according to claim 1, wherein said first memory cell corresponds to a first even address, and said second memory cell corresponds to a first odd address continuous to said first even address.

6. The synchronous semiconductor memory device according to claim 5, further comprising:
   a first memory block including said first and second memory cells; and
   a second memory block including a third memory cell corresponding to a second even address and a fourth memory cell corresponding to a second odd address continuous to said second even address, wherein said data output circuit including:
   a block selection circuit receiving a first pair of data including said first and second data and a second pair of data including third and fourth data respectively read from said third and fourth memory cells for selectively outputting one of said first and second pairs of data as a pair of intermediate data in said normal operation mode and for outputting a pair of data obtained by compressing said first and second pairs of data as said pair of intermediate data in said test mode; and
   an output processing circuit receiving said pair of intermediate data for outputting a prescribed data to said data input/output node, and said output processing circuit includes:
- a selection circuit activated in said normal operation mode for selecting one of said pair of intermediate data in accordance with a control signal for outputting it to said data input/output node; and
- a data processing circuit activated in said test mode for outputting a result obtained by determining if the prescribed relation between two data included in said pair of intermediate data is obtained to said data input/output node.

7. The synchronous semiconductor memory device according to claim 5, further comprising:
- a first memory bank including said first and second memory cells; and
- a second memory bank including a third memory cell corresponding to a second even address and a fourth memory cell corresponding to a second odd address continuous to said second even address and capable of operating independently of said first memory bank, wherein said data output circuit includes:
- an output processing circuit outputting one of two data included in a pair of intermediate data to said data input/output node in said normal operation mode and outputting an OR of said two data to said data input/output node in said test mode; and
- a block selection circuit receiving a first pair of data including said first and second data and a second pair of data including third and fourth data from said third and fourth memory cells for outputting said pair of intermediate data including first and second intermediate data, said block selection circuit including:
  - a first data selection circuit outputting one of said first and third data read from selected one of said banks as said first intermediate data in said normal operation mode and outputting a NOR of said first and third data and inverted values of said second and fourth data as said first intermediate data in said test mode; and
  - a second data selection circuit outputting one of said second and fourth data read from selected one of said banks as said second intermediate data in said normal operation mode and outputting a NOR of said second and fourth data and inverted values of said first and third data in said test mode as said second intermediate data.

8. The synchronous semiconductor memory device according to claim 7, wherein said first data selection circuit includes:

- a charging circuit for charging a first internal node;
- a first switching circuit for connecting said first internal node to a ground potential in accordance with said first data upon activation of said first memory bank;
- a second switching circuit for connecting said first internal node to the ground potential in accordance with said third data upon activation of said second memory bank;
- a third switching circuit activated in said test mode for connecting said first internal node to the ground potential in accordance with said second data upon activation of said first memory bank; and
- a fourth switching circuit activated in said test mode for connecting said first internal node to the ground potential in accordance with said fourth data upon activation of said second memory bank.

9. The synchronous semiconductor memory device according to claim 7, wherein said second data selection circuit includes:
- a charging circuit for charging a second internal node;
- a fifth switching circuit for connecting said second internal node to a ground potential in accordance with said fourth data upon activation of said first memory bank;
- a sixth switching circuit for connecting said second internal node to the ground potential in accordance with said fourth data upon activation of said second memory bank;
- a seventh switching circuit activated in said test mode for connecting said second internal node to the ground potential in accordance with said first data upon activation of said first memory bank; and
- an eighth switching circuit activated in said test mode for connecting said second internal node to the ground potential in accordance with said third data upon activation of said second memory bank.

10. The synchronous semiconductor memory device according to claim 7, further comprising an address generation circuit generating a bank address signal activating one of said first and second banks in said normal operation mode and generating a bank address signal activating both of said first and second banks in said test mode.

11. The synchronous semiconductor memory device according to claim 7, further comprising a data writing circuit writing data in a group to said first to fourth memory cells in said test mode, applying the same data as that written to said first memory cell to said third memory cell and applying inverted values of data written to said first memory cell to said second and fourth memory cells.

* * * * *